(12) United States Patent
Jia

(10) Patent No.: US 11,337,321 B2
(45) Date of Patent: May 17, 2022

(54) FOLDABLE TERMINAL

(71) Applicant: GUANGDONG OPPO MOBILE TELECOMMUNICATIONS CORP., LTD., Guangdong (CN)

(72) Inventor: Yuhu Jia, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/783,773

(22) Filed: Feb. 6, 2020

(65) Prior Publication Data
US 2020/0281085 A1 Sep. 3, 2020

(30) Foreign Application Priority Data

Feb. 28, 2019 (CN) .......................... 201910150028.6
Feb. 28, 2019 (CN) .......................... 201920253852.X

(51) Int. Cl.
*H05K 5/02* (2006.01)
*H04M 1/02* (2006.01)
*H05K 5/00* (2006.01)

(52) U.S. Cl.
CPC ............ *H05K 5/0226* (2013.01); *H04M 1/02* (2013.01); *H05K 5/0017* (2013.01)

(58) Field of Classification Search
CPC .... G06F 1/1656; G06F 1/1681; G06F 1/1637; G06F 1/1616; H05K 5/03; H05K 7/1427
See application file for complete search history.

(56) References Cited

U.S. PATENT DOCUMENTS 7,032,984 B2 * 4/2006 Kim ...................... G06F 1/1601
312/223.2
7,311,366 B2 * 12/2007 Kim ...................... G06F 1/1601
312/223.2
(Continued)

FOREIGN PATENT DOCUMENTS

| CN | 105549689 A | 5/2016 |
|---|---|---|
| CN | 105549690 A | 5/2016 |

(Continued)

OTHER PUBLICATIONS

International search report issued in corresponding international application No. PCT/CN2020/075129 dated May 11, 2020.
(Continued)

*Primary Examiner* — Anthony M Haughton
*Assistant Examiner* — Theron S Milliser
(74) *Attorney, Agent, or Firm* — Young Basile Hanlon & MacFarlane, P.C.

(57) ABSTRACT

A foldable terminal is provided. The foldable terminal includes a casing assembly, a display screen, and a foldable mechanism. The casing assembly includes a first casing and a second casing. The display screen is coupled with the first casing and the second casing. The foldable mechanism includes a carrier plate, a first cover plate, a second cover plate, a first rotating arm, and a second rotating arm. The carrier plate has a first side rotatably coupled with the first cover plate and a second side rotatably coupled with the second cover plate. The first cover plate is slidably coupled with the first casing, and the second cover plate is slidably coupled with the second casing.

20 Claims, 19 Drawing Sheets

(56) References Cited

U.S. PATENT DOCUMENTS

| | | | | |
|---|---|---|---|---|
| 8,660,621 | B2* | 2/2014 | Masser | G06F 1/1681 |
| | | | | 455/575.3 |
| 9,235,239 | B2* | 1/2016 | van Dijk | G09F 9/301 |
| 9,348,450 | B1 | 5/2016 | Kim | |
| 10,082,827 | B2* | 9/2018 | Yamauchi | G06F 1/1681 |
| 10,185,355 | B2* | 1/2019 | Watamura | G06F 1/1641 |
| 10,416,710 | B2* | 9/2019 | Mizoguchi | G06F 1/1637 |
| 10,423,019 | B1* | 9/2019 | Song | G06F 1/1652 |
| 10,481,634 | B2* | 11/2019 | Mizoguchi | G06F 1/1637 |
| 10,520,989 | B1* | 12/2019 | Hsu | G06F 1/1616 |
| 10,754,377 | B2* | 8/2020 | Siddiqui | H04M 1/0216 |
| 10,775,852 | B2* | 9/2020 | Kim | H04M 1/0216 |
| 10,845,850 | B1* | 11/2020 | Kang | H04M 1/022 |
| 10,863,635 | B2* | 12/2020 | Watamura | G06F 1/1652 |
| 10,893,129 | B2* | 1/2021 | Harmon | H04M 1/0268 |
| 2002/0104769 | A1* | 8/2002 | Kim | G06F 1/1637 |
| | | | | 206/320 |
| 2011/0063783 | A1* | 3/2011 | Shim | G06F 1/1681 |
| | | | | 361/679.01 |
| 2013/0021762 | A1* | 1/2013 | van Dijk | H05K 5/0017 |
| | | | | 361/749 |
| 2015/0233162 | A1* | 8/2015 | Lee | G06F 1/1626 |
| | | | | 16/223 |
| 2018/0196468 | A1* | 7/2018 | Watamura | G06F 1/1652 |
| 2018/0292860 | A1* | 10/2018 | Siddiqui | G06F 1/1618 |
| 2019/0086965 | A1* | 3/2019 | Kuramochi | G06F 1/1616 |
| 2019/0166703 | A1* | 5/2019 | Kim | G06F 1/1679 |
| 2019/0391618 | A1* | 12/2019 | Hsu | G06F 1/1681 |
| 2020/0281085 | A1* | 9/2020 | Jia | H04M 1/022 |
| 2020/0371564 | A1* | 11/2020 | Kim | H05K 5/0226 |

FOREIGN PATENT DOCUMENTS

| | | |
|---|---|---|
| CN | 105979032 A | 9/2016 |
| CN | 206369993 U | 8/2017 |
| CN | 108520701 A | 9/2018 |
| CN | 108738258 A | 11/2018 |
| EP | 2696257 A2 | 2/2014 |

OTHER PUBLICATIONS

Extended European search report issued in corresponding European application No. 20158235.0 dated Jul. 24, 2020.
Indian Examination Report for IN Application 202014006711 dated May 13, 2021. (6 pages).

* cited by examiner

FOLDABLE TERMINAL

CROSS-REFERENCE TO RELATED APPLICATION(S)

This application claims priority to Chinese Patent Application Serial No. 201910150028.6, filed on Feb. 28, 2019, and Chinese Patent Application Serial No. 201920253852.X, filed on Feb. 28, 2019, the disclosures of both of which are hereby incorporated by reference in their entireties.

TECHNICAL FIELD

This disclosure relates to the technical field of terminals, and particularly to a foldable terminal.

BACKGROUND

Existing foldable terminals are provided with various foldable mechanisms to satisfy a change of a length of two side surfaces of the terminal when the terminal is switched between unfolded status to folded status. However, these foldable mechanisms generally occupy a large space, which is not conducive to the miniaturization of the terminal.

SUMMARY

Implementations aim to provide a foldable terminal having a small size.

A foldable terminal is provided. The foldable terminal includes a casing assembly, a display screen, and a foldable mechanism. The casing assembly includes a first casing and a second casing. The display screen is coupled with the first casing and the second casing. The foldable mechanism includes a carrier plate, a first cover plate, a second cover plate, a first rotating arm, and a second rotating arm. The carrier plate has a first side rotatably coupled with the first cover plate and a second side rotatably coupled with the second cover plate. The first cover plate is slidably coupled with the first casing, and the second cover plate is slidably coupled with the second casing. The first rotating arm has one end rotatably coupled with the second side of the carrier plate and the other end rotatably coupled with the first casing. The second rotating arm has one end rotatably coupled with the first side of the carrier plate and the other end rotatably coupled with the second casing.

A foldable terminal is provided. The foldable terminal includes a flexible screen, a casing assembly, and a foldable mechanism. The casing assembly includes a first casing and a second casing, and the first casing and the second casing are respectively coupled with the flexible screen. The foldable mechanism includes a carrier plate, a first cover plate, a second cover plate, a first rotating arm, and a second rotating arm. The first cover plate and the second cover plate are rotatably coupled with the carrier plate respectively. The first rotating arm has one end rotatably coupled with the carrier plate and the other end rotatably coupled with the first casing. The second rotating arm has one end rotatably coupled with the carrier plate and the other end rotatably coupled with the second casing.

When the foldable terminal is switched between unfolded status and folded status, the first casing is operable to drive the first cover plate to rotate relative to the carrier plate, and a part of the first casing is slidably extended out of or retracted into the first cover plate, and the second casing is operable to drive the second cover plate to rotate relative to the carrier plate and a part of the second casing is slidably extended out of or retracted into the second cover plate. When the foldable terminal is in the folded status, an orthogonal projection of the first rotating arm on a reference plane and an orthogonal projection of the second rotating arm on the reference plane intersect, and the reference plane is a geometric plane perpendicular to an axis of rotation of the first cover plate.

A foldable terminal is provided. The foldable terminal includes a casing assembly, a display screen, and a foldable mechanism. The display screen is coupled with the casing assembly and includes a non-display surface. The foldable mechanism includes a carrier plate and a fixing plate secured to the carrier plate. When the foldable terminal is in unfolded status, the fixing plate abuts against the non-display surface of the display screen, and when the foldable terminal is in folded status, the fixing plate and the display screen define a gap.

BRIEF DESCRIPTION OF DRAWINGS

In order to describe technical solutions of implementations or the related art more clearly, the following will give a brief description of accompanying drawings used for describing the implementations or the related art. Apparently, the accompanying drawings described below merely illustrate some implementations. Those of ordinary skill in the art can also obtain other accompanying drawings based on the accompanying drawings described below without creative efforts.

DETAILED DESCRIPTION

In order to enable those skilled in the art to better understand solutions, technical solutions embodied in implementations will be described in a clear and comprehensive manner in conjunction with the accompanying drawings. The accompanying drawings described below merely illustrate some implementations. However, the disclosure can be implemented in many different forms and is not limited to the implementations described herein. Instead, these implementations are provided to better understand the disclosure.

Terminal device" used herein includes, but is not limited to, a device configured to be coupled with other devices via any one or more of the connection modes described in the following and configured to receive and/or transmit communication signals. The connection modes include: (1) coupling via wired circuit connection such as a public switched telephone network (PSTN), a digital subscriber line (DSL), a digital cable, or direct cable connection; (2) coupling via a wireless interface such as a cellular network, a wireless local area network (WLAN), a digital television network such as a digital video broadcasting-H (DVB-H) network, a satellite network, or an amplitude modulation-frequency modulation (AM-FM) broad transmitter.

The terminal device configured to communicate via a wireless interface may be referred to as a "terminal". Examples of the terminal include, but are not limited to, the following electronic devices: (1) a satellite phone or a cellular phone; (2) a personal communications system (PCS) terminal that has cellular radiotelephone and data processing, fax, and data communication capabilities; (3) a radiotelephone, a pager, Internet/Intranet access, a web browser, a notepad, a calendar, a personal digital assistant (PDA) equipped with a Global Positioning System (GPS) receiver; (4) a conventional laptop and/or palm-type receiver; (5) a conventional laptop and/or palm-type radiotelephone transceiver, or the like.

Figure 1:
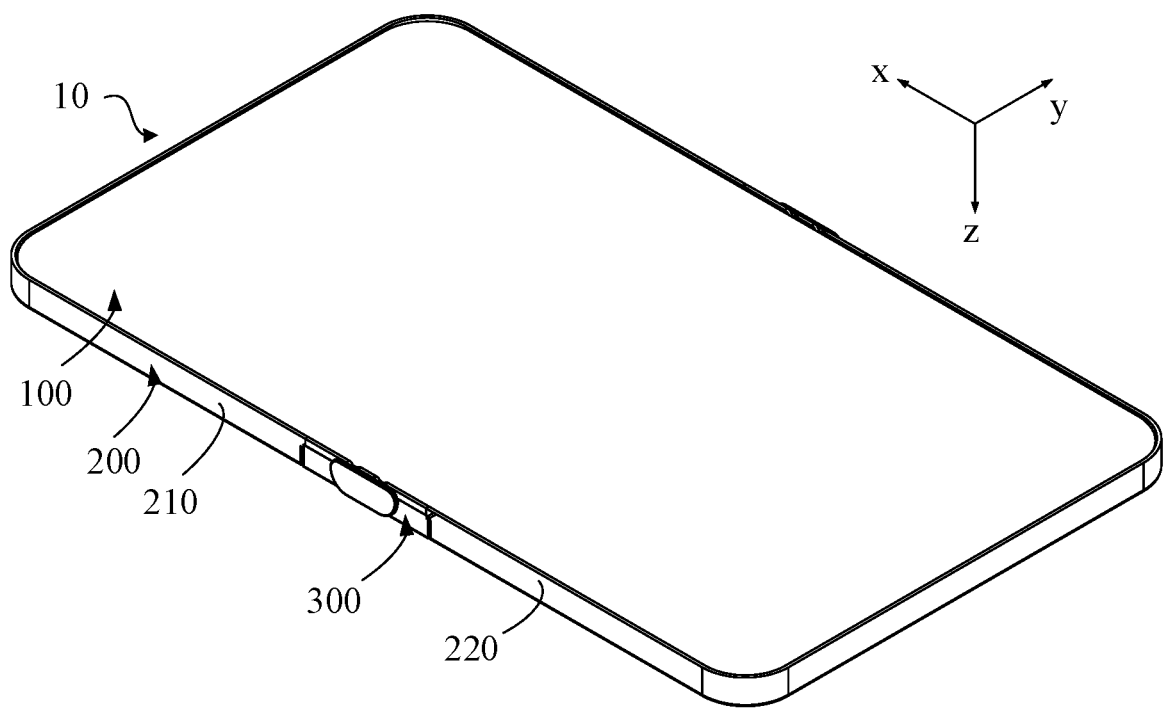
FIG. 1 is a perspective view of a foldable terminal in unfolded status according to at least one implementation.
Figure 2:
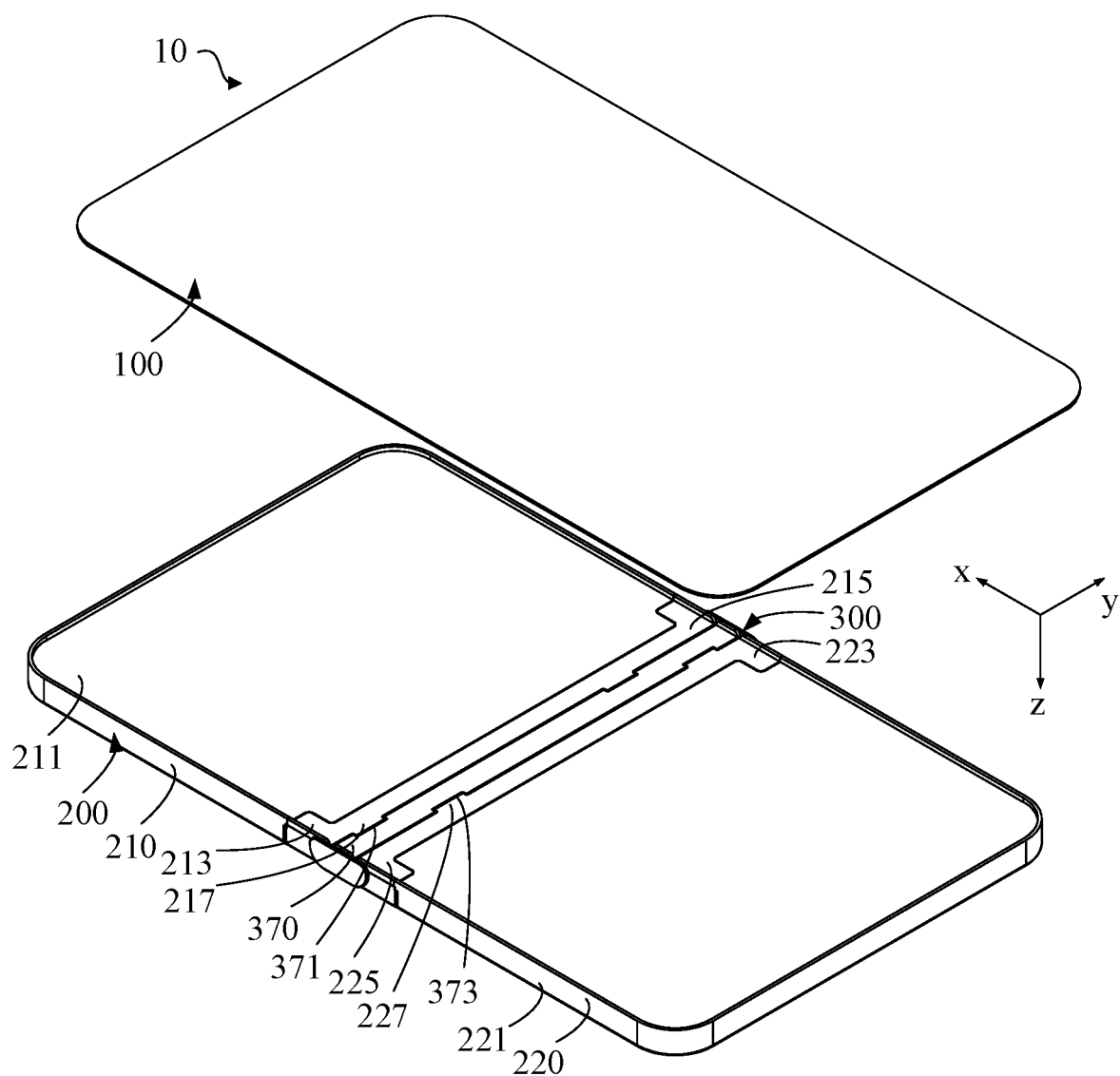
FIG. 2 is an exploded view of the foldable terminal in FIG. 1.
Figure 3:
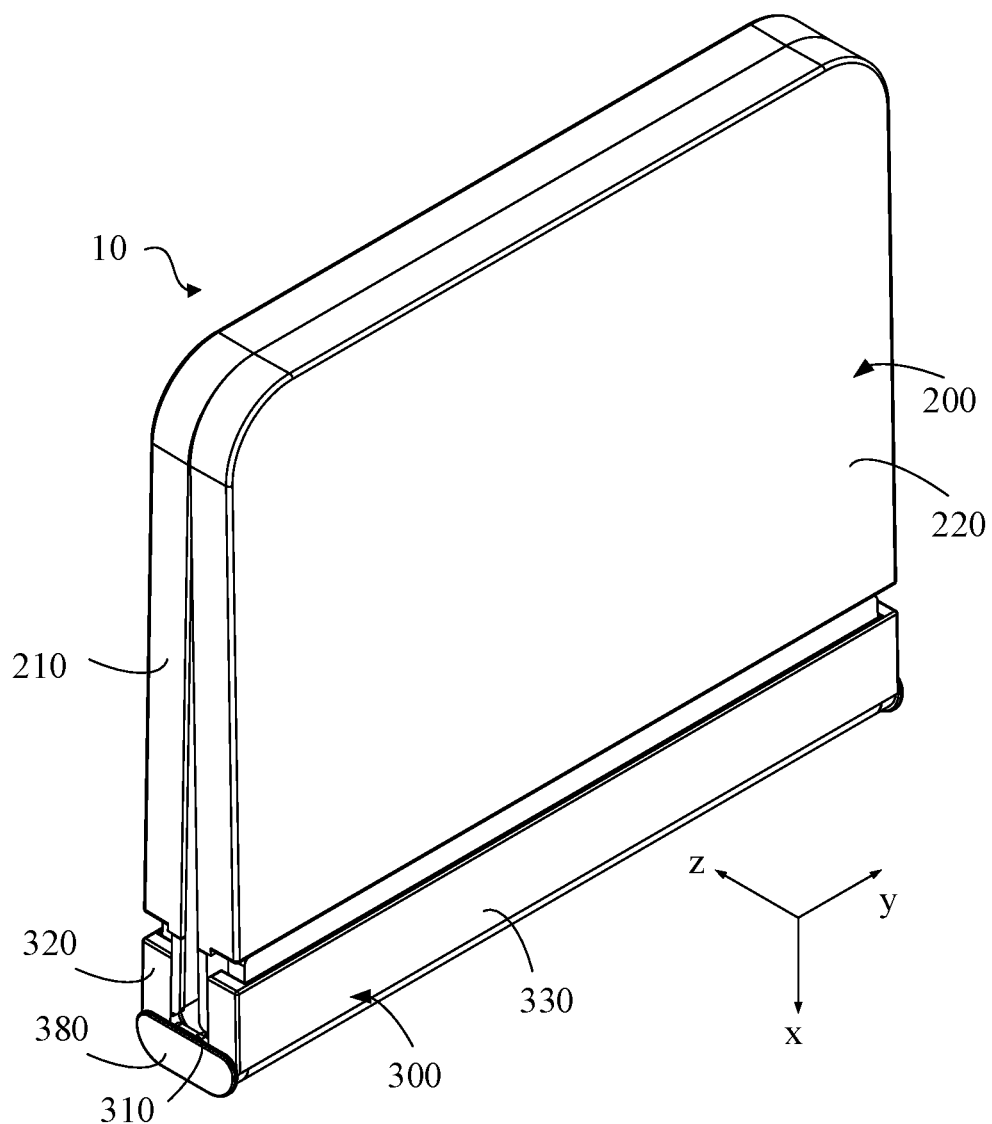
FIG. 3 is a perspective view of the foldable terminal in FIG. 1 in folded status.
Figure 4:
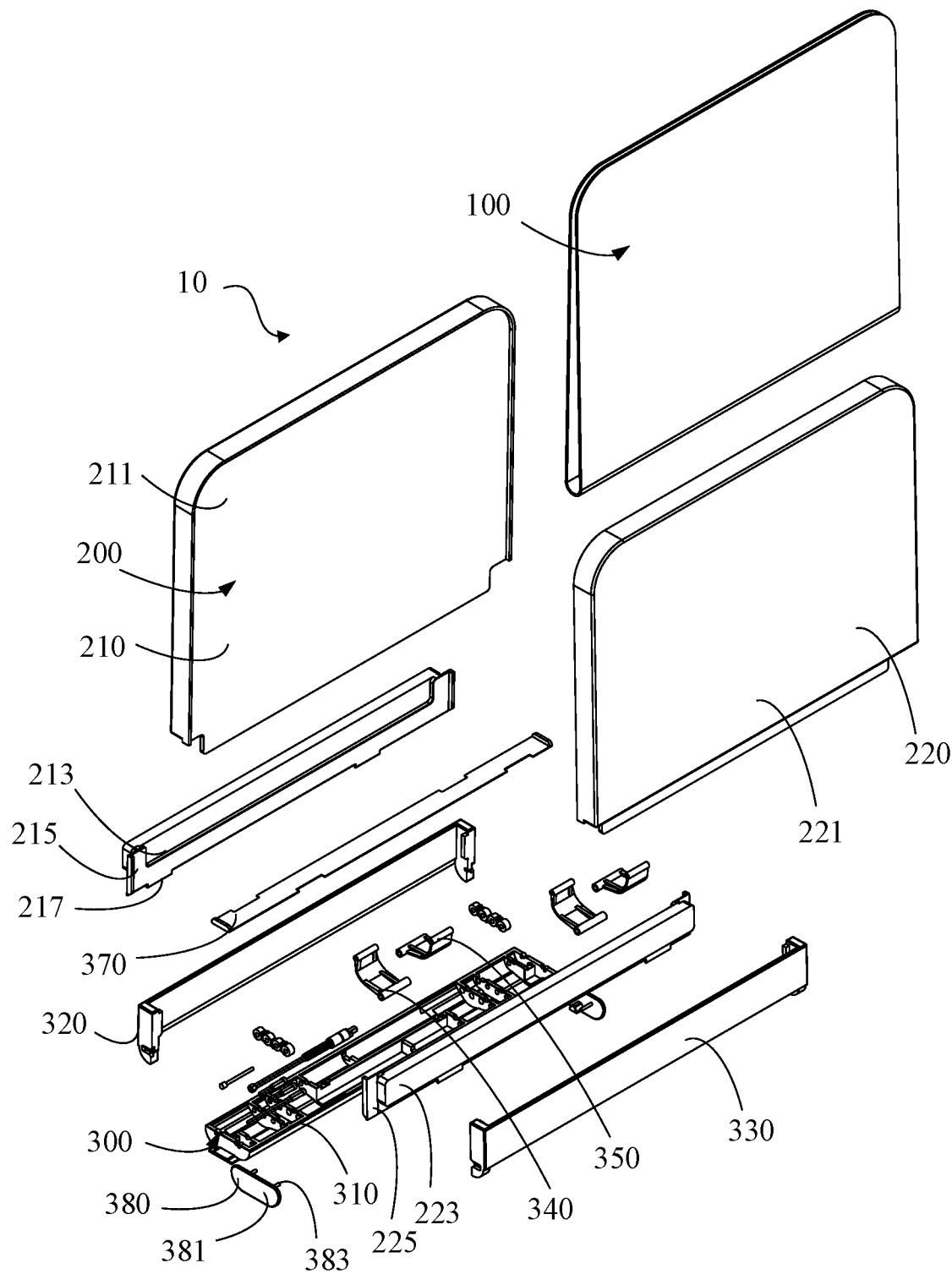
FIG. 4 is an exploded view of the foldable terminal in FIG. 3.

Referring to FIG. 1 and FIG. 2, in at least one implementation, a foldable terminal 10 is a smart phone. The foldable terminal 10 includes a display screen 100, a casing assembly 200, and a foldable mechanism 300. As illustrated in FIG. 3 and FIG. 4, the casing assembly 200 includes a first casing 210 and a second casing 220. The first casing 210 and the second casing 220 are respectively coupled with the display screen 100. The display screen 100 can display information and provide an interactive interface for a user. The display screen 100 can be secured to the first casing 210 and the second casing 220 in a manner such as dispensing. The first casing 210 and the second casing 220 each may have a space for allowing a circuit board, a battery, a receiver, a speaker, a camera, and other electronic components of the foldable terminal 10 to be received in. The circuit board may be integrated with electronic components such as a main controller, a storage unit, an antenna module, and a power management module of the foldable terminal 10. The battery can supply power to the display screen 100, the circuit board, the receiver, the speaker, the camera, and other electronic components. In some implementations, the foldable terminal 10 may also be a tablet PC or the like.

Figure 5:
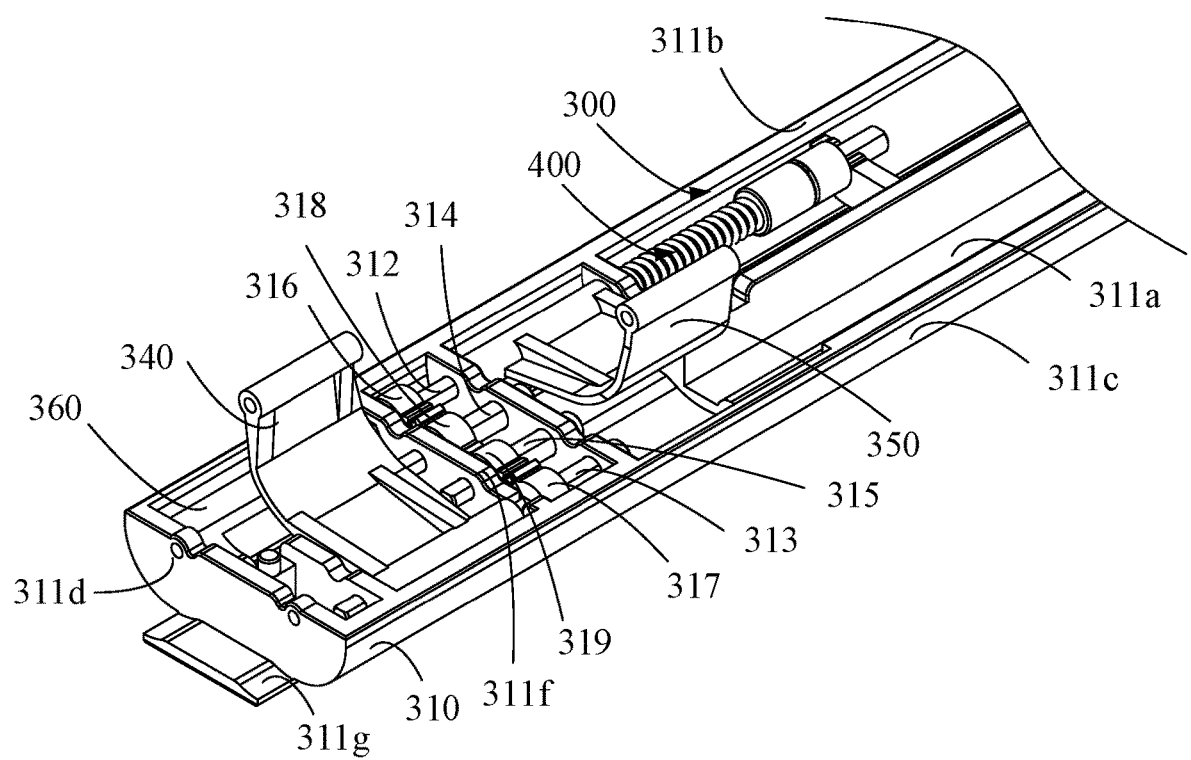
FIG. 5 is a perspective view of a foldable mechanism of the foldable terminal in FIG. 3, some elements of the foldable mechanism being removed.
Figure 6:
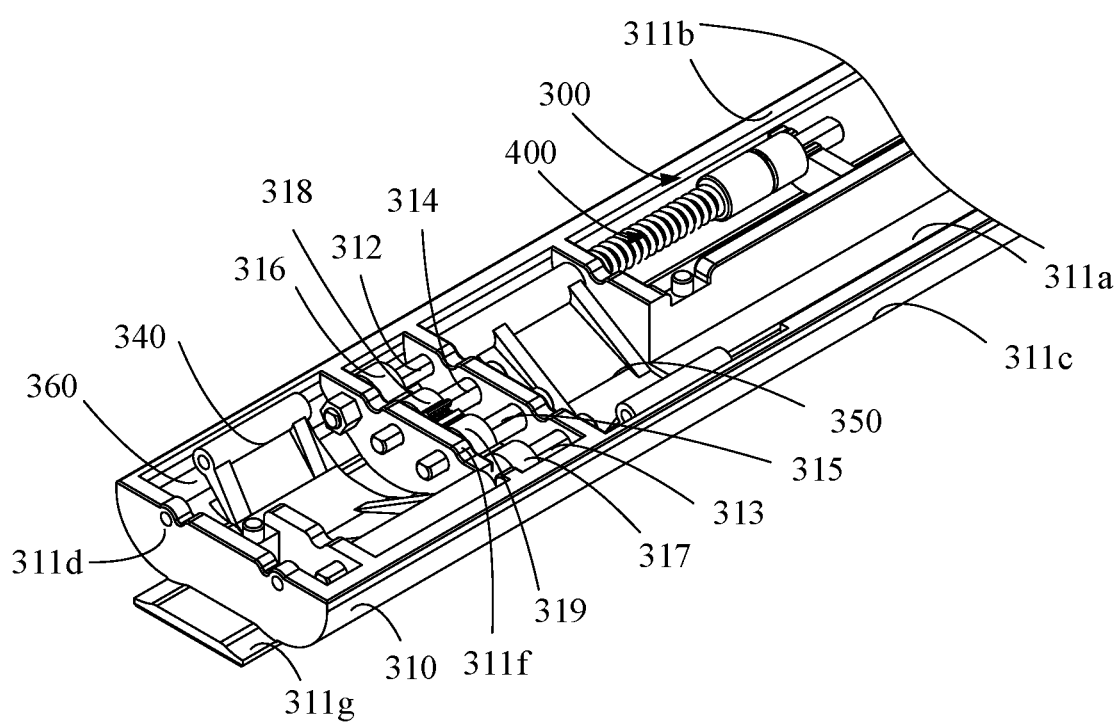
FIG. 6 is a perspective view of a foldable mechanism of the foldable terminal in FIG. 1, some elements of the foldable mechanism being removed.
Figure 7:
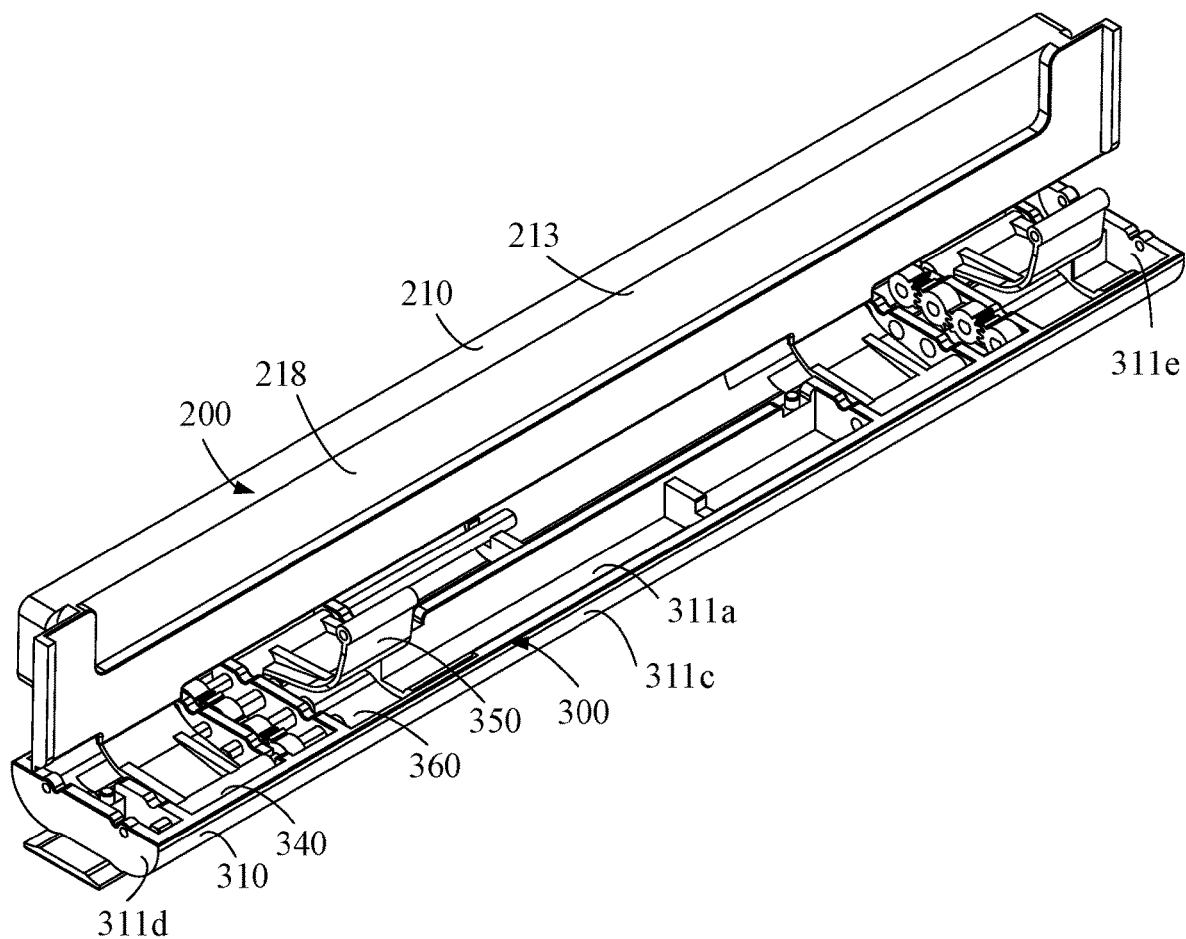
FIG. 7 is a perspective view illustrating a first casing being coupled with the foldable mechanism of the foldable terminal in FIG. 5.
Figure 8:
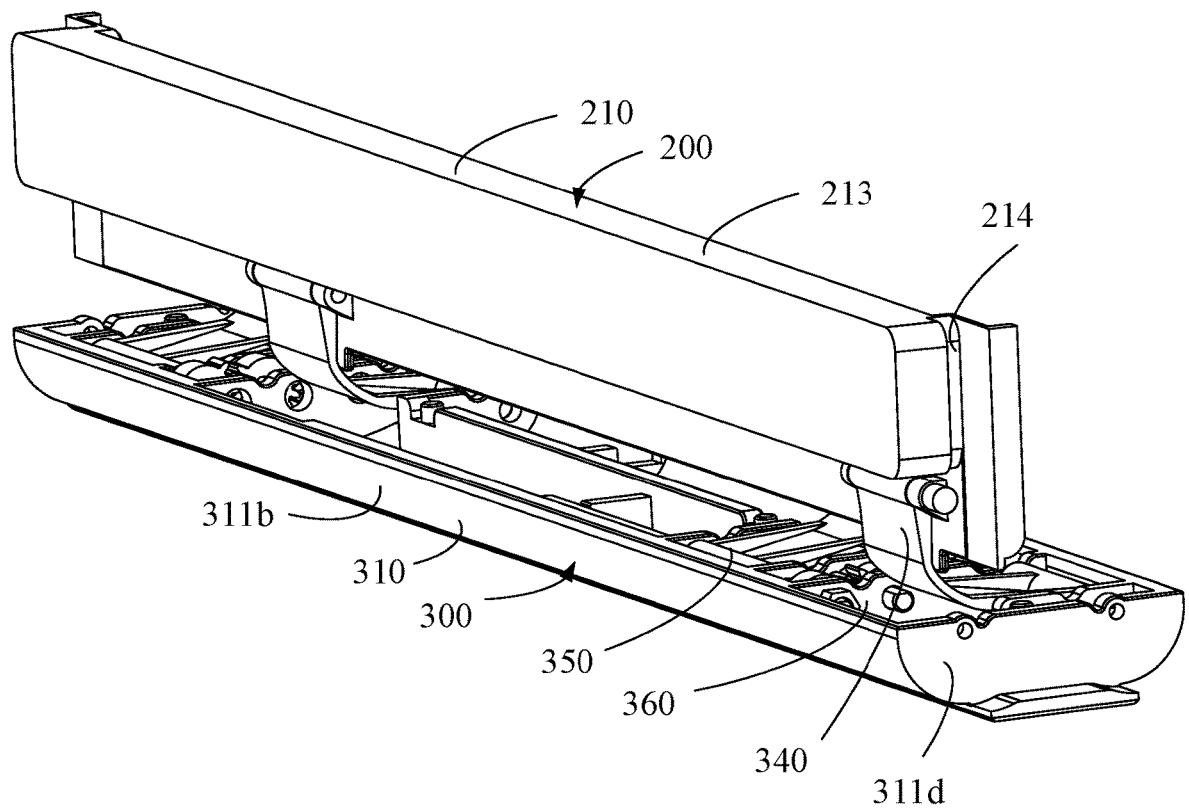
FIG. 8 is a perspective view illustrating the first casing being coupled with the foldable mechanism of the foldable terminal in FIG. 7, viewed from another viewpoint.

As illustrated in FIG. 3 and FIG. 4, the casing assembly 200 can switch the foldable terminal 10 between unfolded status and folded status via the foldable mechanism 300. The foldable mechanism 300 includes a carrier plate 310, a first cover plate 320, a second cover plate 330, a first rotating arm 340, and a second rotating arm 350. The first cover plate 320 and the second cover plate 330 each may have a strip-shaped block shape. The first cover plate 320 and the second cover plate 330 are rotatably coupled with the carrier plate 310 respectively. As illustrated in FIG. 5 and FIG. 6, the first rotating arm 340 and the second rotating arm 350 are substantially L-shaped. As illustrated in FIG. 7 and FIG. 8, one end of the first rotating arm 340 is rotatably coupled with the carrier plate 310, and the other end of the first rotating arm 340 is rotatably coupled with the first casing 210. One end of the second rotating arm 350 is rotatably coupled with the carrier plate 310, and the other end of the second rotating arm 350 is rotatably coupled with the second casing 220. One side of the first rotating arm 340 away from the display screen 100 may be a curved surface to realize smooth transition, such that at least a portion of a cross section of the first rotating arm 340 is substantially an elliptical arc. Further, one side of the second rotating arm 350 away from the display screen 100 may be a curved surface to realize smooth transition, such that at least a portion of a cross section of the second rotating arm 350 is substantially an elliptical arc. In some implementations, the cross section of the first rotating arm 340 and the cross section of the second rotating arm 350 can also be other similar shapes.

Figure 9:
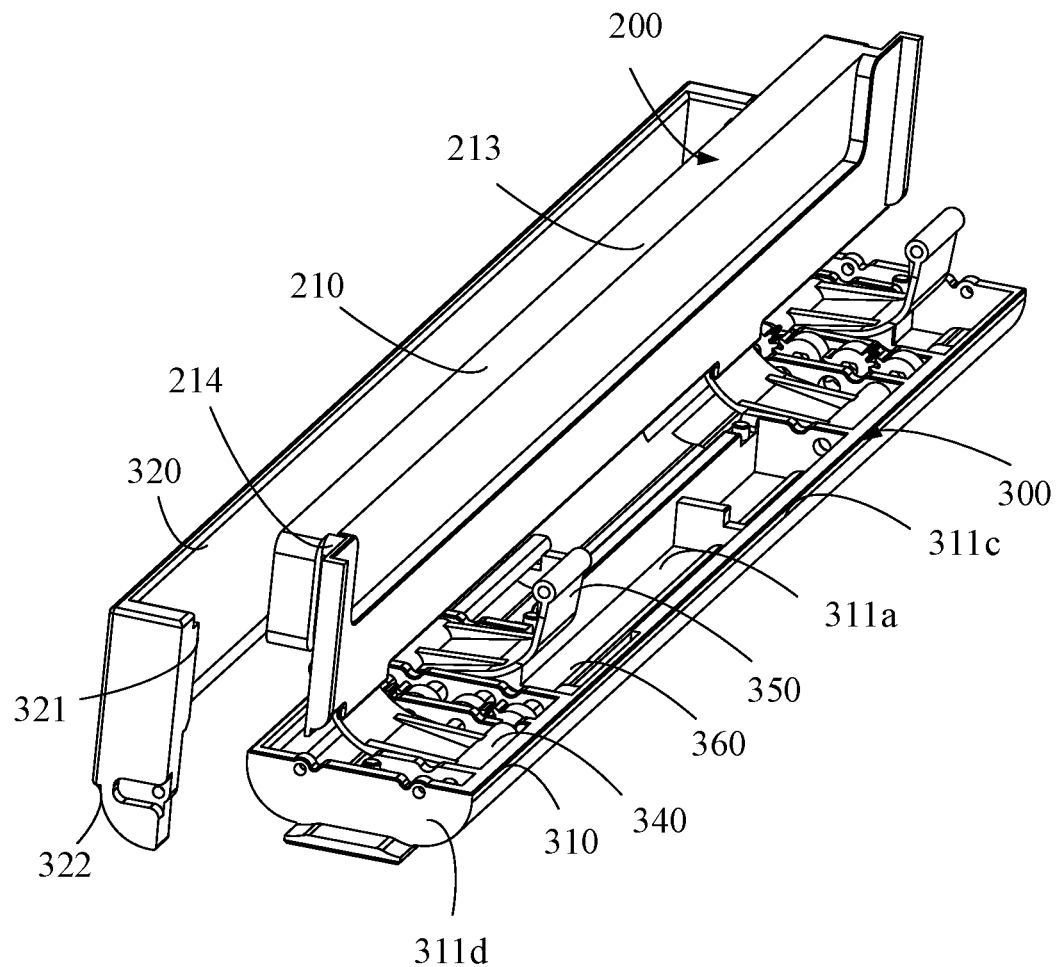
FIG. 9 is a perspective view illustrating a first cover plate of the foldable terminal in FIG. 7 being removed from a carrier plate.
Figure 10:
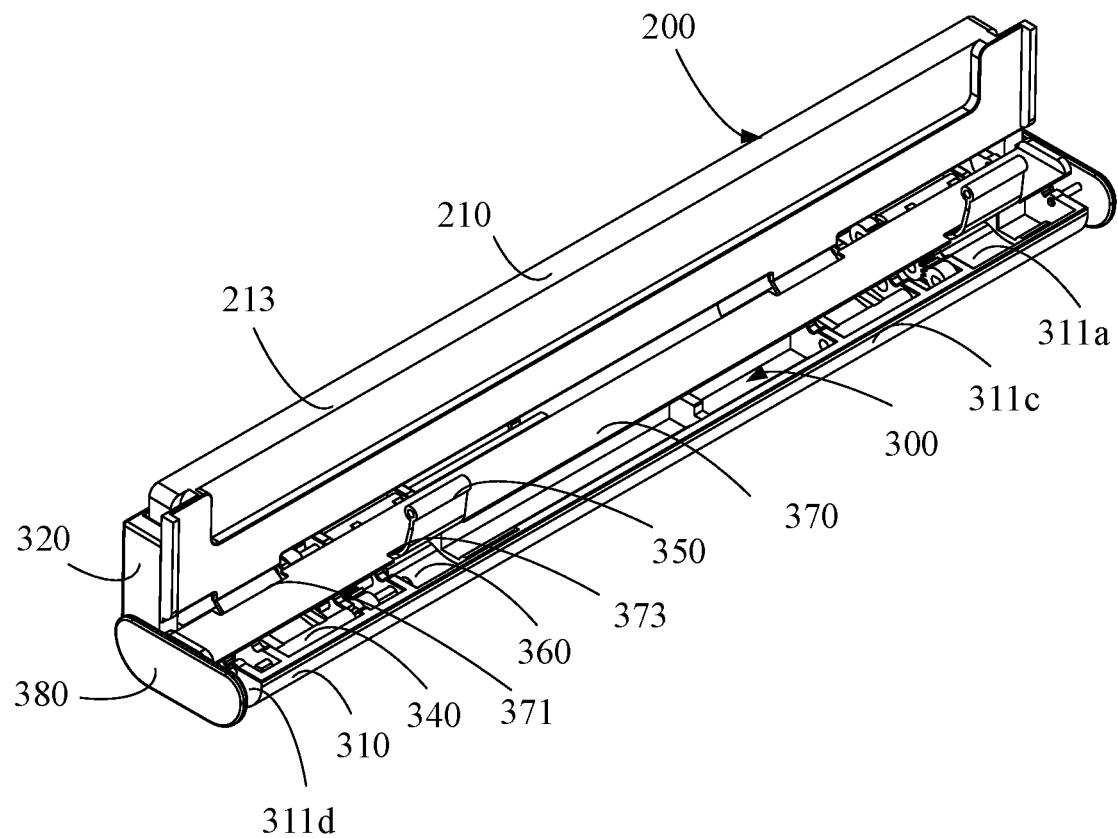
FIG. 10 is a perspective view illustrating the carrier plate being coupled with the first cover plate of the foldable terminal in FIG. 9.
Figure 11:
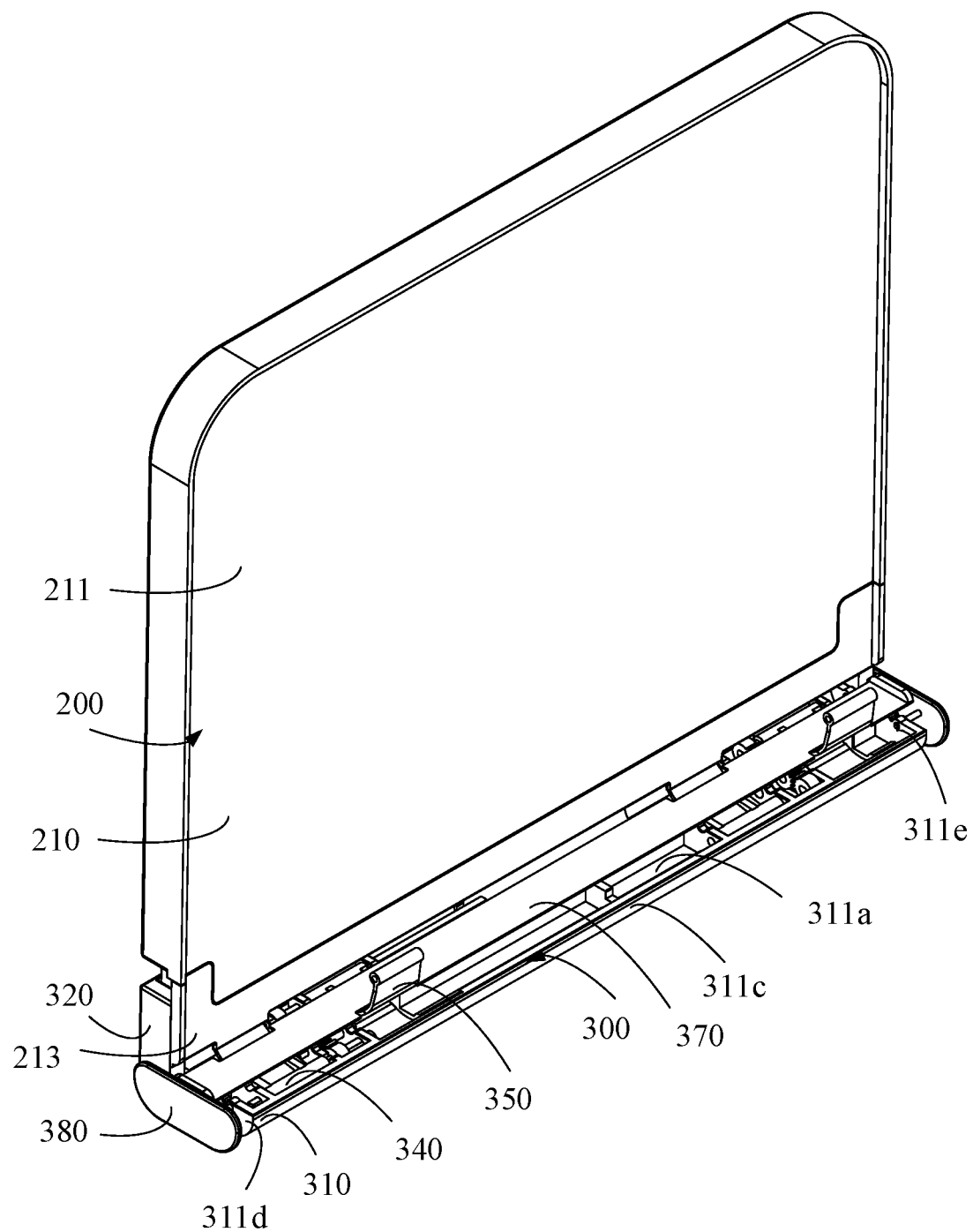
FIG. 11 is a perspective view illustrating the foldable mechanism being coupled with the first casing of the foldable terminal in FIG. 10.

As illustrated in FIG. 9, FIG. 10, and FIG. 11, when the foldable terminal 10 is switched between the unfolded status and the folded status, the first casing 210 drives the first cover plate 320 to rotate relative to the carrier plate 310 and a part of the first casing 210 is slidably extended out of or retracted into the first cover plate 320, and the second casing 220 drives the second cover plate 330 to rotate relative to the carrier plate 310 and a part of the second casing 220 is slidably extended out of or retracted into the second cover plate 330. In at least one implementation, when the foldable terminal 10 is switched from the unfolded status to the folded status, the first casing 210 can slide relative to the first cover plate 320, the second casing 220 can slide relative to the second cover plate 330, such that the casing assembly 200 may be adaptively extended. When the foldable terminal 10 is switched from the folded status to the unfolded status, the first casing 210 can slide relative to the first cover plate 320, the second casing 220 can slide relative to the second cover plate 330, such that the casing assembly 200 may be adaptively retracted.

Since a part of the first casing 210 is slidably extended out of or retracted into the first cover plate 320 and a part of the second casing 220 is slidably extended out of or retracted into the second cover plate 330, when the foldable terminal 10 is switched between the unfolded status and the folded status, the casing assembly 200 can be adaptively extended or retracted (that is, the casing assembly 200 is operable to telescope), to meet a length difference between the display screen 100 and the casing assembly 200, thereby enabling smooth unfolding and folding of the foldable terminal 10.

As illustrated in FIG. 1 and FIG. 2, in at least one implementation, in the unfolded status, the foldable terminal 10 is substantially rectangular. In such a case, it is possible to take the foldable terminal 10 in the unfolded status as a reference to establish a coordinate system, where a length direction of the foldable terminal 10 may be defined as an x-axis direction, a width direction of the foldable terminal 10 may be defined as a y-axis direction, and a thickness direction of the foldable terminal 10 may be defined as a z-axis direction. As illustrated in FIG. 5 and FIG. 6, the first rotating arm 340 and the second rotating arm 350 may be spaced apart from each other in the y-axis direction, and the first rotating arm 340 and the second rotating arm 350 are set in pairs, that is, one first rotating arm 340 and one second rotating arm 350 form a pair. For example, in implementations of FIG. 5 and FIG. 6, the foldable terminal 10 may include two first rotating arms 340 and two second rotating arms 350, and the two first rotating arms 340 and the two second rotating arms 350 can form two pairs according to the above manner, where one pair is arranged at one end of the carrier plate 310, and the other pair is arranged at the other end of the carrier plate 310. The following takes one of the two pairs of the first rotating arm 340 and the second rotating arm 350 as an example, where the first rotating arm 340 is closer to an edge of the display screen 100 than the second rotating arm 350 in the width direction of the foldable terminal 10. In some implementations, the foldable terminal 10 can be provided with only one first rotating arm 340 and one second rotating arm 350, and both of them are respectively disposed at the two ends of the carrier plate 310. Alternatively, the foldable terminal 10 may also be provided with two or more pairs of the first rotating arm 340 and the second rotating arm 350.

Figure 12:
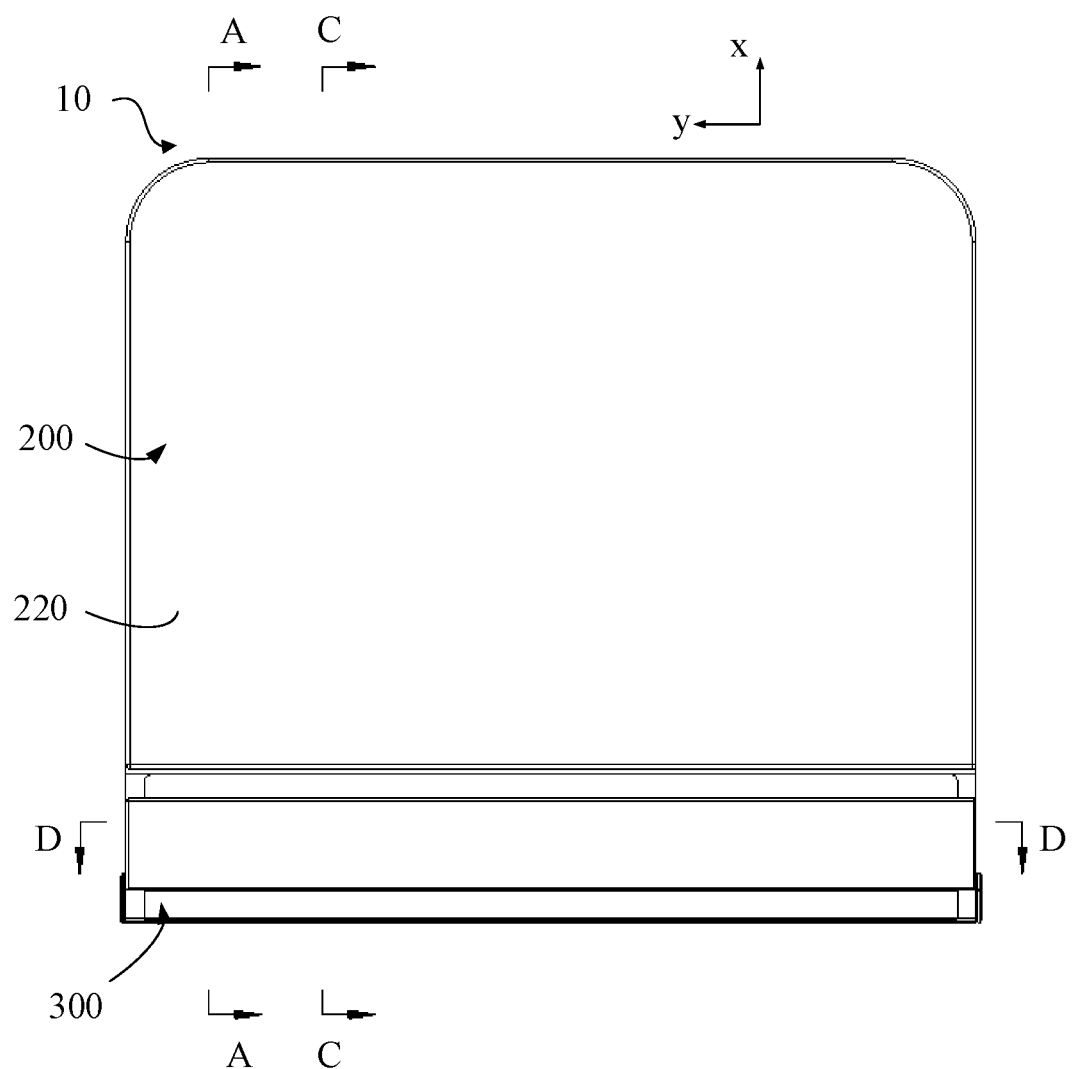
FIG. 12 is a front view of the foldable terminal in FIG. 3.
Figure 13:
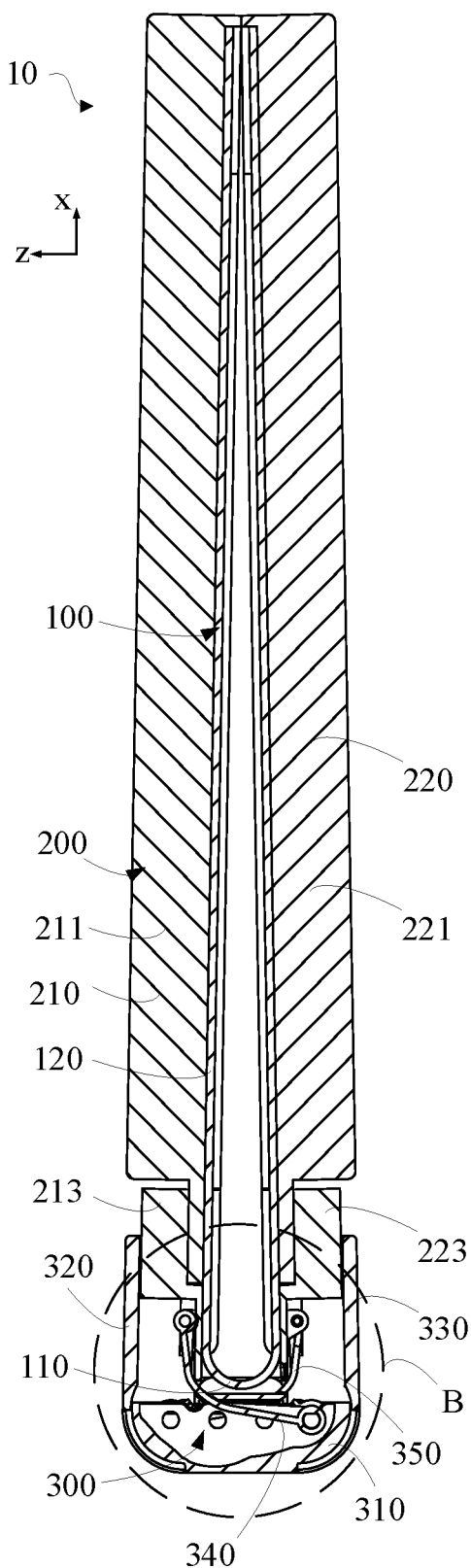
FIG. 13 is a cross-sectional view of the foldable terminal illustrated in FIG. 12, taken along line A-A.
Figure 14:
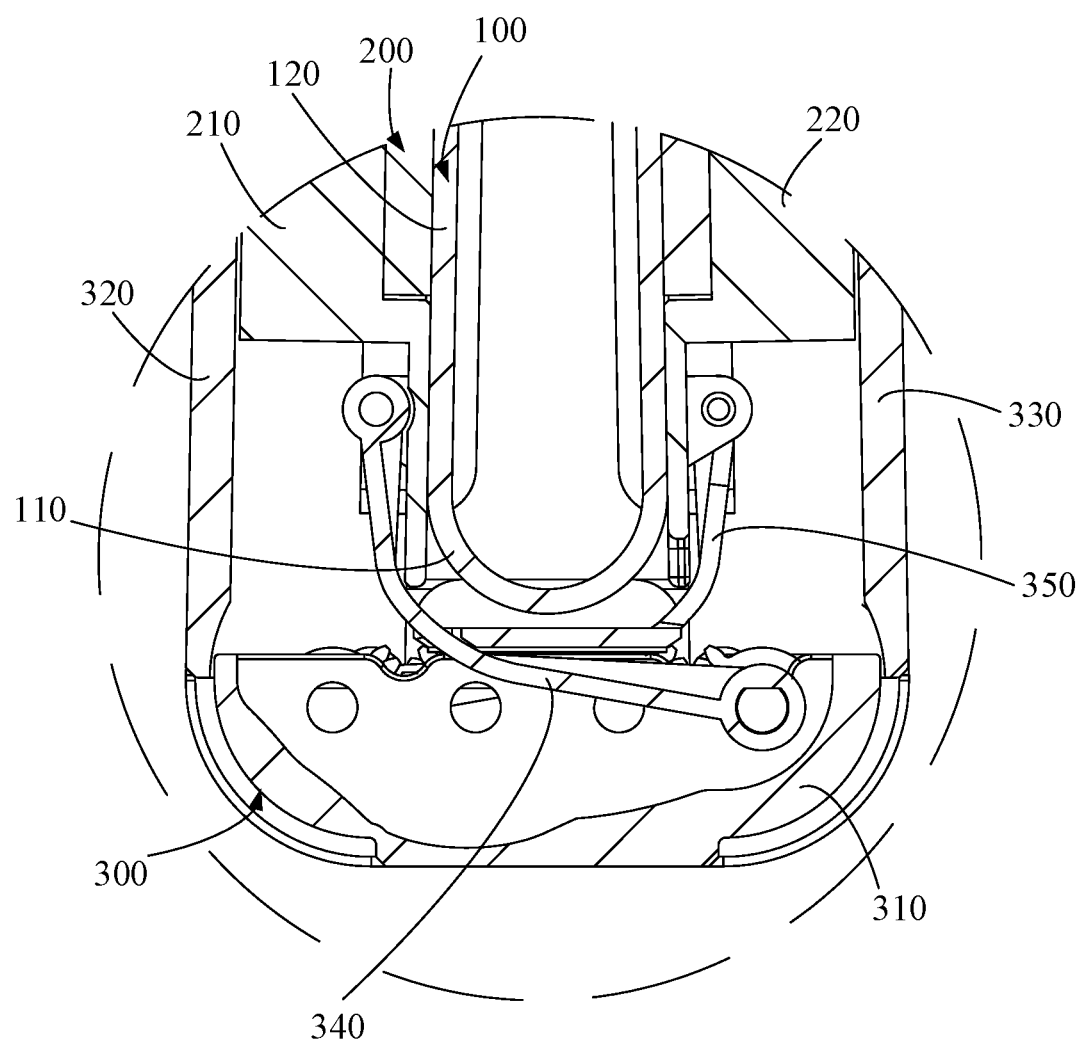
FIG. 14 is an enlarged view of part B of the foldable terminal in FIG. 13.

In some implementations, when the foldable terminal 10 is fully unfolded, the display screen 100 is flattened, and in this case the foldable terminal 10 can provide a large screen display. As illustrated in FIG. 3, when the foldable terminal 10 is in the folded status, the first casing 210 and the second casing 220 are stacked together, and the display screen 100 is sandwiched between the first casing 210 and the second casing 220. As illustrated in FIG. 12, FIG. 13, and FIG. 14, the display screen 100 is a flexible screen. The flexible screen includes a bendable portion 110 and planar regions 120 coupled with both sides of the bendable portion 110. The following takes the flexible screen in the unfolded status as a reference position of zero degree. Since the flexible screen has a maximum bending radius, when the foldable terminal 10 is in the folded status, an angle between the planar regions 120 at the both sides of the bendable portion 110 of the flexible screen may be an acute angle. Alternatively, when the foldable terminal 10 is in the folded status, the planar regions 120 at the both sides may be parallel to each other. In some implementations, the display screen 100 may include two Liquid Crystal Display (LCD) screens, and the two LCD screens are respectively coupled with the first casing 210 and the second casing 220. A joint between the two LCD screens are made from a flexible material such as a silica gel material or the like, and as a result the display screen may be easy to be bent. Alternatively, the display screen 100 may include two Organic Light-Emitting Diode (OLED) screens, and the two OLED screens are respectively coupled with the first casing 210 and the second casing 220. A joint between the two OLED screens are made from a flexible material such as a silica gel material or the like, and as a result the display screen may be easy to be bent.

As illustrated in FIG. 12 to FIG. 15, a geometric plane perpendicular to the width direction (y-axis direction) of the foldable terminal 10 is set as a reference plane. In some implementations, the above reference plane can also be obtained by setting a geometric plane perpendicular to an axis of rotation of the first cover plate 320 or an axis of rotation of the second cover plate 330 when the axis of rotation of the first cover plate 320 or the axis of rotation of the second cover plate 330 is set as a reference. In the folded status, an orthogonal projection of the first rotating arm 340 on the reference plane and an orthogonal projection of the second rotating arm 350 on the reference plane intersect. Under the condition that the cross section of the first rotating arm 340 and the cross section of the second rotating arm 350 are substantially in elliptical arc shape or other similar shapes, in the folded status, one side of the first rotating arm 340 facing the display screen 100 and one side of the second rotating arm 350 facing the display screen 100 may be close to the display screen 100 to form a receiving space adapted to a bent shape of the display screen 100, and further a distance between the one end of the first rotating arm 340 coupled with the first casing 210 and the one end of the second rotating arm 350 coupled with the second casing 220 may be small. When the foldable terminal 10 is in the folded status, the first rotating arm 340 of the curved shape and the second rotating arm 350 of the curved shape may form an opening with a small width, so that arrangement of components can be compact, and thus the foldable terminal 10 may be thin in the folded status.

As described above, when the foldable terminal 10 is in the folded status, since the orthogonal projection of the first rotating arm 340 on the reference plane and the orthogonal projection of the second rotating arm 350 on the reference plane intersect, a small receiving space may be formed by the first rotating arm 340 and the second rotating arm 350 in the folded status to allow the bendable part 110 of the flexible screen to be received in, thus facilitating the compact arrangement of the components of the foldable terminal 10 and the reduction of the thickness of the foldable terminal 10 in the folded status. In addition, since one end of the first rotating arm 340 is rotated relative to the first casing 210 and the other end of the first rotating arm 340 is rotated relative to the carrier plate 310, and one end of the second rotating arm 350 is rotated relative to the second casing 220 and the other end of the second rotating arm 350 is rotated relative to the carrier plate 310, during the rotation of the foldable terminal 10, the flexible screen can be prevented from sliding relative to the first casing 210 or the second casing 220, so as to reduce the tensile stress exerted on the flexible screen by the casing assembly 200, and prevent the flexible screen from being deformed by being pulled in the process of rotation, thereby prolonging the service life of the display screen.

As illustrated in FIG. 5 and FIG. 6, in at least one implementation, the foldable mechanism 300 includes a first rotating shaft 312 and a second rotating shaft 313 that are rotatably coupled with the carrier plate 310. The first rotating arm 340 is coupled with the second rotating shaft 313, and the second rotating arm 350 is coupled with the first rotating shaft 312. The first rotating arm 340 can rotate relative to the carrier plate 310 via the second rotating shaft 313, and the second rotating arm 350 can rotate relative to the carrier plate 310 via the first rotating shaft 312. In addition, the foldable mechanism 300 further includes a third rotating shaft 314 coupled with the carrier plate 310, a fourth rotating shaft 315 coupled with the carrier plate 310, a first gear 316 coupled with the first rotating shaft 312, a second gear 317 coupled with the second rotating shaft 313, a third gear 318 coupled with the third rotating shaft 314, and a fourth gear 319 coupled with the fourth rotating shaft 315. The first gear 316 and the fourth gear 319 are respectively engaged with the third gear 318, and the second gear 317 is engaged with the fourth gear 319. The first casing 210 is operable to drive the second gear 317 to rotate via the first rotating arm 340, and the second casing 220 is operable to drive the first gear 316 to rotate via the second rotating arm 350. The foldable mechanism 300 having the above configuration can be used to realize a synchronous rotation of the first casing 210 and the second casing 220.

In at least one implementation, the first gear 316, the second gear 317, the third gear 318, and the fourth gear 319 are intermittent gears. The first gear 316 is secured to the first rotating shaft 312, the second gear 317 is secured to the second rotating shaft 313, the third gear 318 is secured to the third rotating shaft 314, and the fourth gear 319 is secured to the fourth rotating shaft 315. The first gear 316 is integrally formed with or detachably coupled with the first rotating shaft 312. The second gear 317 is integrally formed with or detachably coupled with the second rotating shaft 313. The third gear 318 is integrally formed with or detachably coupled with the third rotating shaft 314. The fourth gear 319 is integrally formed with or detachably coupled with the fourth rotating shaft 315. The first rotating shaft 312, the second rotating shaft 313, the third rotating shaft 314, and the fourth rotating shaft 315 are rotatably coupled with the carrier plate 310 respectively. The first rotating arm 340 is secured to the second rotating shaft 313, and the second rotating arm 350 is secured to the first rotating shaft 312. The first casing 210 is operable to drive the second gear 317 to rotate via the first rotating arm 340 and the second rotating shaft 313, thereby driving the fourth gear 319 and the fourth rotating shaft 315 to rotate, and the second casing 220 is operable to drive the first gear 316 to rotate via the second rotating arm 350 and the first rotating shaft 312, thereby driving the third gear 318 and the third rotating shaft 314 to rotate, such that the synchronous rotation of the first casing 210 and the second casing 220 can be realized.

In some implementations, the third gear 318 is rotatably coupled with the third rotating shaft 314, and the third rotating shaft 314 is secured to the carrier plate 310. The fourth gear 319 is rotatably coupled with the fourth rotating shaft 315, and the fourth rotating shaft 315 is secured to the carrier plate 310. Compared with the structure in which both ends of the third rotating shaft 314 and the fourth rotating shaft 315 have a supporting function and a rotating function, with aid of the above configuration, the supporting function and the rotating function can be separated, thereby enhancing the structural stability and preventing the third rotating shaft 314 or the fourth rotating shaft 315 from being damaged by excessively large rotational force.

Figure 18:
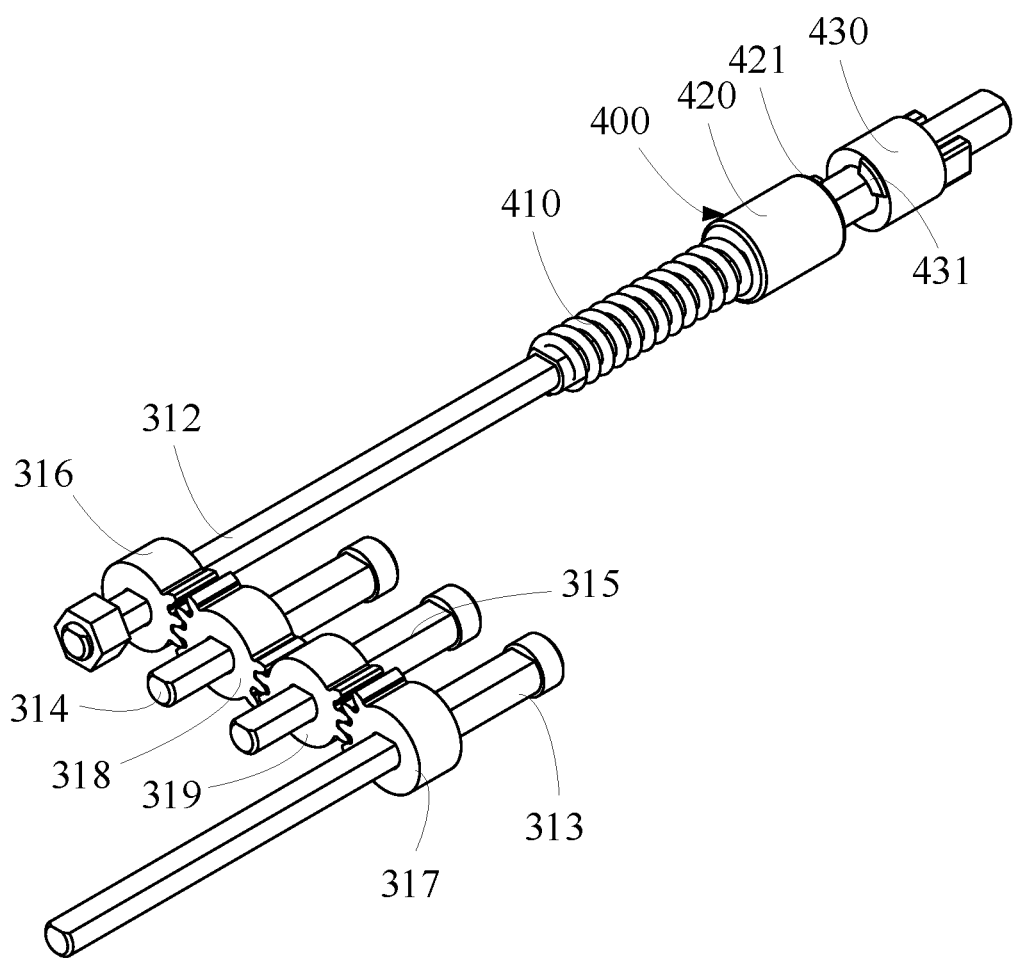
FIG. 18 is a schematic view illustrating a first rotating shaft cooperating with a damping assembly of the foldable terminal in FIG. 4.

As illustrated in FIG. 18, the foldable terminal 10 further includes a damping assembly 400. The damping assembly 400 is coupled with the foldable mechanism 300. When the foldable terminal 10 is switched between the unfolded status and the folded status, the damping assembly 400 can change rotational damping of the casing assembly 200. In FIG. 18, the damping assembly 400 includes an elastic member 410 sleeved on the first rotating shaft 312, a movable cam 420 sleeved on the first rotating shaft 312 and slidable along the first rotating shaft 312, and a fixing cam 430 secured to the carrier plate 310 as illustrated in FIG. 5 and FIG. 6. One end of the elastic member 410 may abut against the first rotating shaft 312, and the other end of the elastic member 410 may abut against the movable cam 420. In another implementation, one end of the elastic member 410 may abut against the carrier plate 310, and the other end of the elastic member 410 may abut against the movable cam 420. In at least one implementation, the elastic member 410 is implemented as a spring. When the foldable terminal 10 is switched between the unfolded status and the folded status, the second casing 220 is operable to drive the first rotating shaft 312 to rotate relative to the carrier plate 310 via the second rotating arm 350, and the first rotating shaft 312 is operable to drive the movable cam 420 to rotate, thereby enabling the movable cam 420 to abut against the fixing cam 430. When the elastic member 410 is in a compressed state, the movable cam 420 can press the fixing cam 430. During the unfolding and folding of the foldable terminal 10, a friction between the movable cam 420 and the fixing cam 430 can be used for instant positioning of the first casing 210 and the second casing 220. It can be understood that the damping assembly 400 can also be disposed on the second rotating shaft 313, or the third rotating shaft 314, or the fourth rotating shaft 315, to achieve a jerk effect of the foldable terminal 10 during the unfolding and folding the foldable terminal 10.

In some implementations, one side of the movable cam 420 facing the fixing cam 430 is provided with a first protrusion 421, and one side of the fixing cam 430 facing the movable cam 420 is provided with a second protrusion 431. When the foldable terminal 10 is switched between the unfolded status and the folded status, the first protrusion 421 can slide along the second protrusion 431 to change an extrusion pressure exerted on the movable cam 420 by the elastic member 410, thereby changing the rotational damping of the casing assembly 200. The cooperation of the first protrusion 421 and the second protrusion 431 can be used to achieve the effect of the jerk positioning at a specific angle. In addition, a start position and an end position of the first protrusion 421 and the second protrusion 431 can be provided, and the movable cam 420 slides along the first rotation shaft 312 at the start position and the end position, to enable the extrusion applied to the fixing cam 430 by the movable cam 420 to be suddenly reduced, thus providing a clear and timely feedback for the user. For example, multiple first protrusions 421 or multiple second protrusions 431 may be provided, and therefore an angle of 30 degrees, an angle of 60 degrees, an angle of 90 degrees, or an angle of 120 degrees between the two planar regions 120 of the display screen 100 can be presented, thereby providing a clear and timely abrupt.

As illustrated in FIG. 5 and FIG. 6, the carrier plate 310 defines a receiving groove 360. The first gear 316, the second gear 317, the third gear 318, the fourth gear 319, the first rotating shaft 312, the second rotating shaft 313, the third rotating shaft 314, and the fourth rotating shaft 315 are in the receiving groove 360. As illustrated in FIG. 6, when the foldable terminal 10 is in the unfolded status, the first rotating arm 340 and the second rotating arm 350 are received in the receiving groove 360. As illustrated in FIG. 7 and FIG. 8, compared with the unfolded status, when the foldable terminal 10 is in the folded status, one end of the first rotating arm 340 coupled with the first casing 210 is far away from a bottom of the receiving groove 360, and one end of the second rotating arm 350 coupled with the second casing 220 is far away from the bottom of the receiving groove 360. In at least one implementation, when the foldable terminal 10 is in the folded status, one end of the first rotating arm 340 coupled with the first casing 210 extends out from the receiving groove 360, and one end of the second rotating arm 350 coupled with the second casing 220 extends out from the receiving groove 360.

As illustrated in FIG. 5 and FIG. 6, the carrier plate 310 has a bottom wall 311a, a first side wall 311b, a second side wall 311c opposite the first side wall 311b, a first end wall 311d, and a second end wall 311e opposite the first end wall 311*d* (as illustrated in FIG. 7). The first side wall 311*b* is coupled with one side edge of the bottom wall 311*a* and the second side wall 311*c* is coupled with the other side edge of the bottom wall 311*a*. The first end wall 311*d* is coupled with one end of the bottom wall 311*a*, one end of the first side wall 311*b*, and one end of the second side wall 311*c*. The second end wall 311*e* is coupled with the other end of the bottom wall 311*a*, the other end of the first side wall 311*b*, and the other end of the second side wall 311*c*. The first side wall 311*b*, the first end wall 311*d*, the second side wall 311*c*, the second end wall 311*e*, and the bottom wall 311*a* cooperatively define the receiving groove 360. In at least one implementation, the carrier plate 310 may be divided from a middle part of the bottom wall 311*a* in the y-axis direction into two sides, that is, a first side and a second side. In at least one implementation, the first side wall 311*b* is located at the first side of the carrier plate 310, and the second side wall 311*c* is located at the second side of the carrier plate 310. One half of the bottom wall 311*a*, one half of the first end wall 311*d*, and one half of the second end wall 311*e* are on the first side, and the other half of the bottom wall 311*a*, the other half of the first end wall 311*d*, and the other half of the second end wall 311*e* are on the second side. The first cover plate 320 is rotatably coupled with the first side of the carrier plate 310, and the second cover plate 330 is rotatably coupled with the second side of the carrier plate 310. The first cover plate 320 is slidably coupled with the first casing 210, and the second cover plate 330 is slidably coupled with the second casing 220. The first rotating arm 340 has one end rotatably coupled with the second side of the carrier plate 310 and the other end rotatably coupled with the first casing 210. The second rotating arm 350 has one end rotatably coupled with the first side of the carrier plate 310 and the other end rotatably coupled with the second casing 220.

As illustrated in FIG. 5 and FIG. 6, the carrier plate 310 includes a mounting plate 311*f* coupled with the first side wall 311*b* and the second side wall 311*c*. The extension direction of mounting plate 311*f* is substantially parallel to the first end wall 311*d* and the second end wall 311*e*. The two ends of the mounting plate 311*f*, the bottom wall 311*a*, the first side wall 311*b*, and the second side wall 311*c* may be integrally formed. The first rotating shaft 312 is rotatably coupled with one end of the mounting plate 311*f* close to the first side wall 311*b*, and the second rotating shaft 313 is rotatably coupled with the other end of the mounting plate 311*f* close to the second side wall 311*c*. The third rotating shaft 314 and the fourth rotating shaft 315 are coupled with the mounting plate 311*f*. The mounting plate 311*f* can support the first rotating shaft 312, the second rotating shaft 313, the third rotating shaft 314, and the fourth rotating shaft 315.

Figure 15:
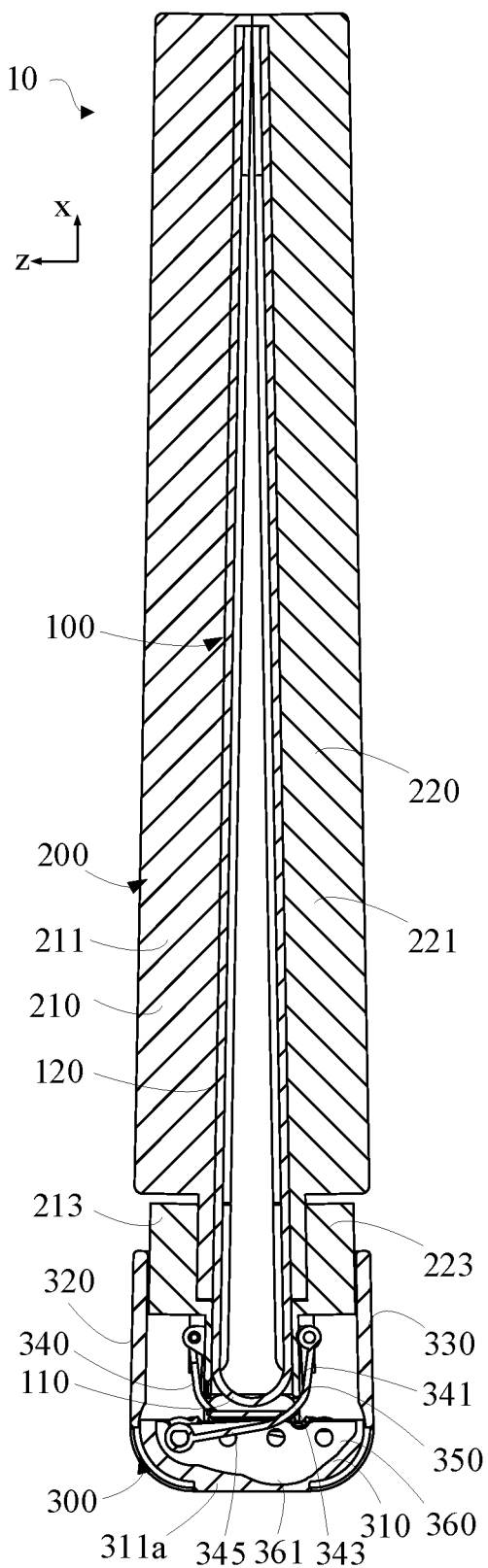
FIG. 15 is a cross-sectional view of the foldable terminal in FIG. 12, taken along line C-C.
Figure 19:
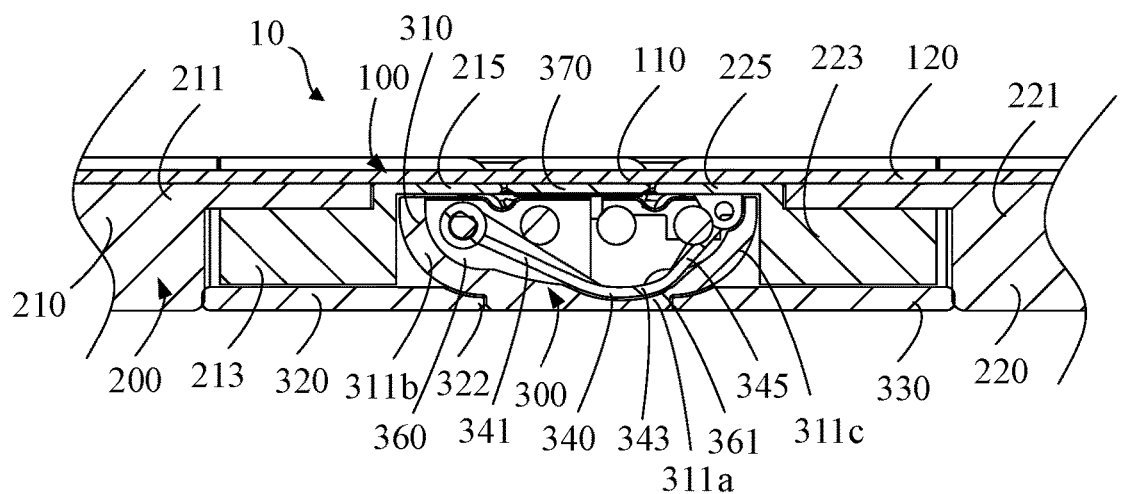
FIG. 19 is a cross-sectional view of the foldable terminal in FIG. 1.

As illustrated in FIG. 19, the first rotating arm 340 may include an extension section 341, a bendable section 343, and a connection section 345. The extension section 341, the bendable section 343, and the connection section 345 are integrally formed. The bendable section 343 is disposed between the extension section 341 and the connection section 345. The extension section 341 is coupled with the first casing 210, and the connection section 345 is coupled with the second rotating shaft 313. The bottom wall 311*a* defines a recess 361 communicating with the receiving groove 360. A sectional curvature of the recess 361 is larger than that of the receiving groove 360, and a sectional curvature of the bendable section 343 is substantially the same as that of the receiving groove 360. When the foldable terminal 10 is in the unfolded status, the bendable section 343 is received in the recess 361. With the above structure, the foldable terminal 10 may be thinner in the unfolded status. The structure of the second rotating arm 350 may be similar to that of the first rotating arm 340. As illustrated in FIG. 15, the second rotating arm 350 may include an extension section 341, an bendable section 343, and an connection section 345. The extension section 341, the bendable section 343, and the connection section 345 are integrally formed. The bendable section 343 is disposed between the extension section 341 and the connection section 345. The extension section 341 of the second rotating arm 350 is coupled with the second casing 220, and the connection section 345 of the second rotating arm 350 is coupled with the first rotating shaft 312. The bottom wall 311*a* defines a recess 361 communicating with the receiving groove 360. A sectional curvature of the recess 361 is larger than that of the receiving groove 360, and a sectional curvature of the bendable section 343 of the second rotating arm 350 is substantially the same as that of the receiving groove 360. When the foldable terminal 10 is in the unfolded status, the bendable section 343 of the second rotating arm 350 is received in the recess 361, enabling the foldable terminal 10 to be thin in the unfolded status.

As illustrated in FIG. 4, in at least one implementation, the foldable mechanism 300 includes a baffle 380. The baffle 380 includes a plate body 381 and two pin shafts 383. The plate body 381 and two pin shafts 383 are integrally formed. One of the two pin shafts 383 passes through the carrier plate 310 and the first cover plate 320, and the other of the two pin shafts 383 passes through the carrier plate 310 and the second cover plate 330. The first cover plate 320 and the second cover plate 330 are rotatably coupled with the carrier plate 310 through the two pin shafts 383 respectively. As illustrated in FIG. 9 and FIG. 10, taking the baffle 380 coupled with the first end wall 311*d* as an example, one of the two pin shafts 383 passes through the first end wall 311*d* and the first cover plate 320, and the other of the two pin shafts 383 passes through the first end wall 311*d* and the second cover plate 330. The first cover plate 320 and the second cover plate 330 are rotatably coupled with the first end wall 311*d* through the two pin shafts 383 respectively. The second end wall 311*e* may also be provided with a baffle 380. A structure and functions of the baffle 380 coupled with the second end wall 311*e* are the same as those of the baffle 380 coupled with first end wall 311*d*, and will not be described herein. As illustrated in FIG. 9 and FIG. 19, the first cover plate 320 may be provided with a step structure 322, and correspondingly, the second cover plate 330 may also be provided with a step structure 322, such that when the foldable terminal 10 is unfolded to be in flatted status, the step structure 322 of the first cover plate 320 and the step structure 322 of the second cover plate 330 can abut against the carrier plate 310, to prevent further rotation of the first casing 210 and the second casing 220. As illustrated in FIG. 5 and FIG. 6, the carrier plate 310 may include two extending arms 311*g*. The two extending arms 311*g* are respectively coupled with the first end wall 311*d* and the second end wall 311*e*. In at least one implementation, one of the two extending arms 311*g* and the first end wall 311*d* are integrally formed, and the other of the two extending arms 311*g* and the second end wall 311*e* are integrally formed. Under the condition that the baffle 380 is coupled with the first end wall 311*d* or the second end wall 311*e*, one side of the extending arm 311*g* facing the baffle 380 can abut against the baffle 380 to support the baffle 380.

As illustrated in FIG. 4 and FIG. 10, the foldable mechanism 300 includes a fixing plate 370 secured to the carrier plate 310. The fixing plate 370 has a strip-shaped block shape and covers a portion of the receiving groove 360. As illustrated in FIG. 19, the display screen 100 includes a display surface and a non-display surface opposite the display surface. The fixing plate 370 abuts against the non-display surface of the display screen 100 in the unfolded status. As illustrated in FIG. 14 and FIG. 15, when the foldable terminal 10 is in the folded status, the fixing plate 370 and the flexible screen 100 define a gap. With the above configuration, in the folded status, the display screen 100 cannot be squeezed by the fixing plate 370, thereby preventing the display screen 100 from being damaged. According to the foregoing implementations, since the cross section of the first rotating arm 340 may be an elliptical arc, and the cross section of the second rotating arm 350 may be an elliptical arc, when the foldable terminal 10 is in the folded status, the first rotating arm 340 and the second rotating arm 350 cannot not squeeze the display screen 100, so as to prevent the display screen 100 from being damaged due to improperly squeezing.

Figure 16:
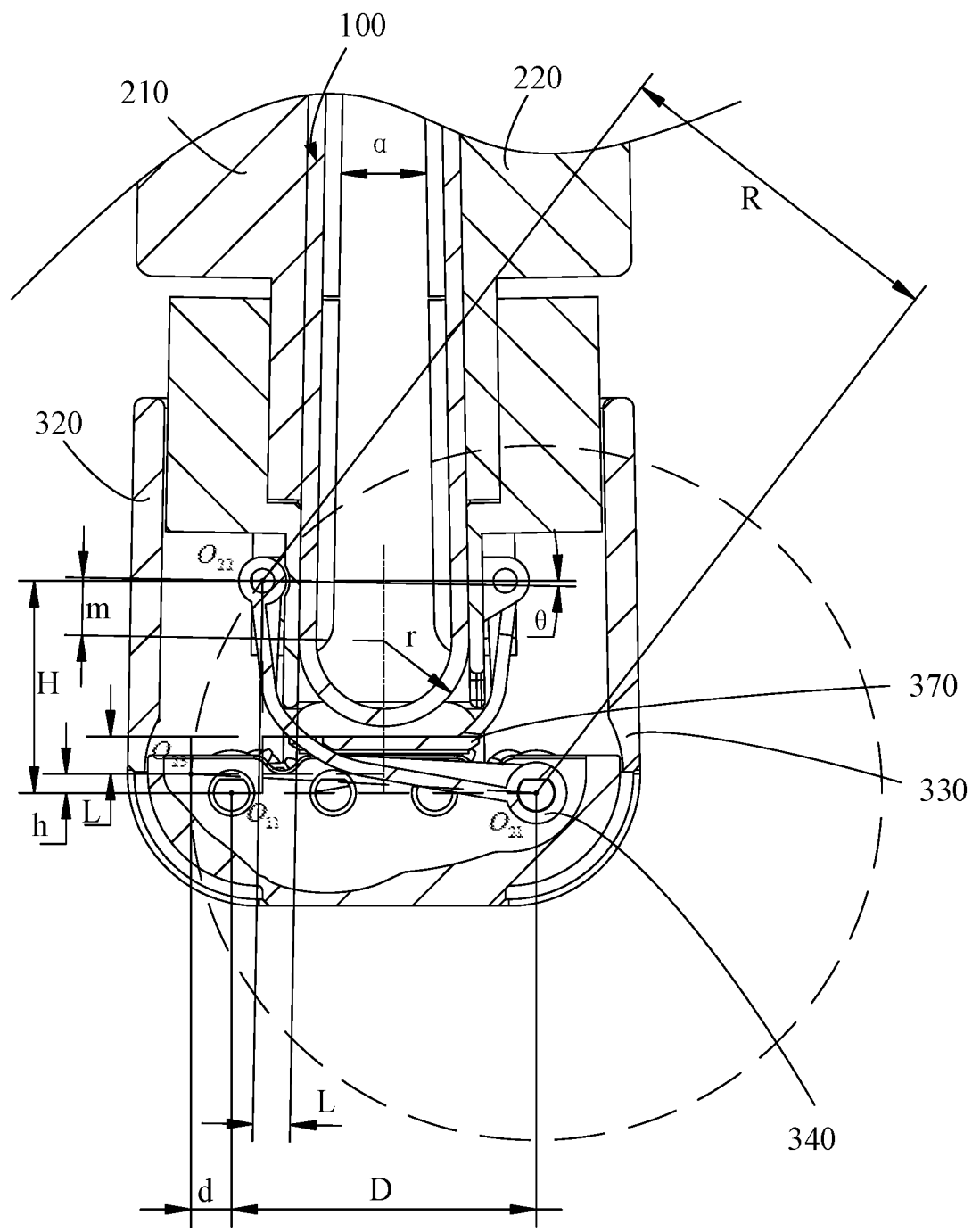
FIG. 16 is a schematic view illustrating a geometric relationship of various components of the foldable terminal in FIG. 13.
Figure 17:
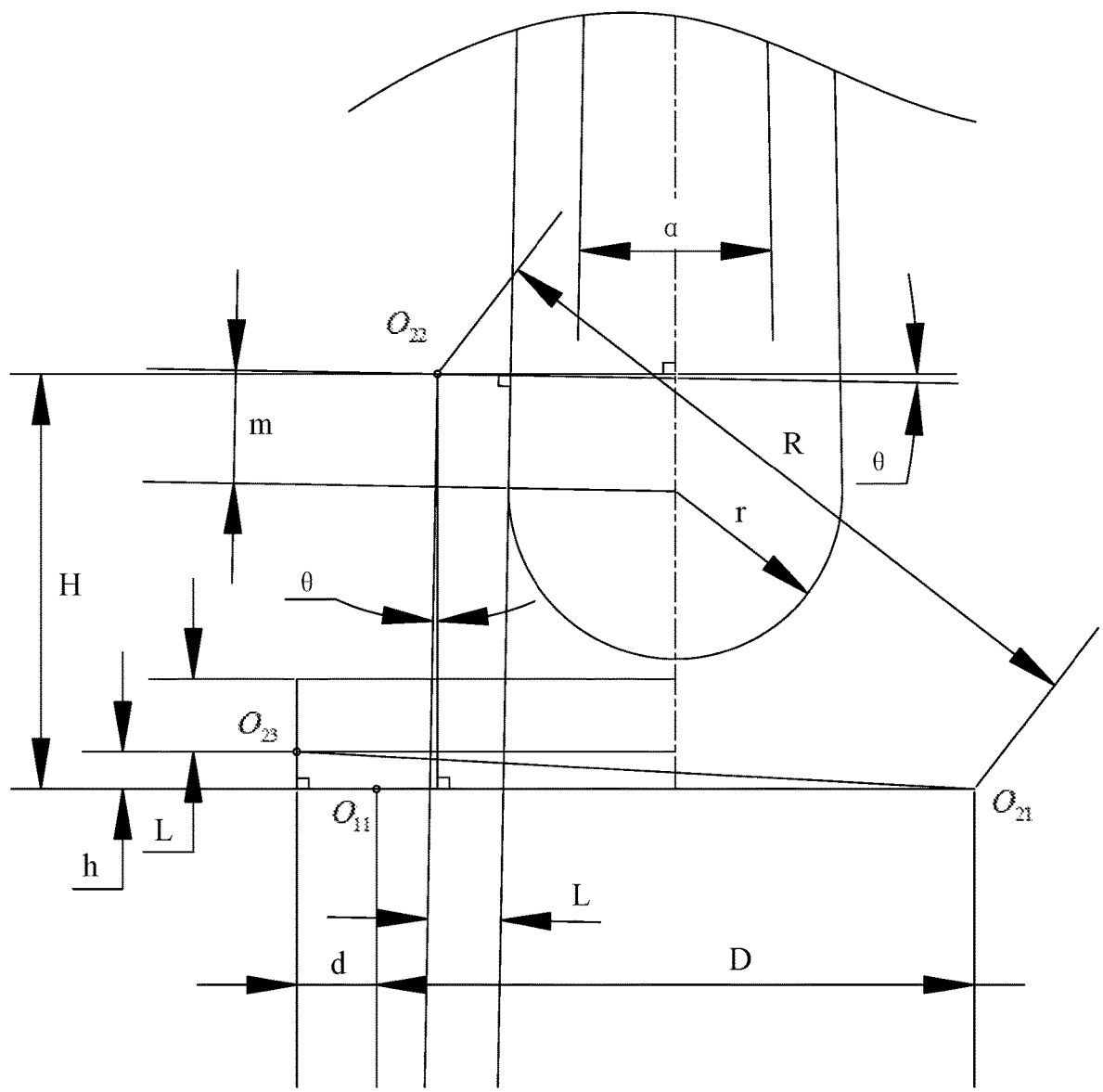
FIG. 17 is a schematic view illustrating a geometric model of various components of the foldable terminal in FIG. 16.

As illustrated in FIG. 16 and FIG. 17, take the first rotating arm 340 as an example to build a geometric model. The parameters in the model are defined as follows:

$O_{11}$: a rotation center of the first rotating shaft 312;
$O_{21}$: a rotation center of the second rotating shaft 313;
$O_{22}$: a rotation center of a joint between the first rotating arm 340 and the first casing 210;
R: a radius of a trajectory circle of $O_{22}$ formed by rotating around $O_{21}$;
r: a bending radius of the flexible screen;
D: a distance between the rotation center $O_{11}$ of the first rotating shaft 312 and the rotation center $O_{21}$ of the second rotating shaft 313;
m: a distance between an orthographic projection of a bending center of the flexible screen on the planar regions of the flexible screen and an orthographic projection of $O_{22}$ on the planar regions of the flexible screen when the foldable terminal 10 is in the folded status;
L: a vertical distance between $O_{22}$ and the non-display surface corresponding to the planar regions of the flexible screen when the foldable terminal 10 is in the folded status; when the foldable terminal 10 is in the unfolded status, the flexible screen is flattened, $O_{22}$ moves to a position $O_{23}$, the non-display surface of the flexible screen abuts against an upper surface of the fixing plate 370, and a distance between $O_{23}$ and the upper surface of the fixing plate 370 is equal to the distance L;
h: when the foldable terminal 10 is in the unfolded status, the flexible screen is flattened, and the trajectory of $O_{22}$ reaches $O_{23}$, and h represents a height between $O_{23}$ and $O_{11}$;
α: an angle between the two planar regions of the flexible screen when the foldable terminal 10 is in the folded status;
H: a height between $O_{22}$ and $O_{21}$ when the foldable terminal 10 is in the folded status;
θ: an angle between the planar region of the flexible screen and an vertical direction when the foldable terminal 10 is in the folded status;
d: a horizontal distance between $O_{23}$ and $O_{11}$ when the foldable terminal 10 is in the unfolded status.

According to geometric relations: θ=α/2
According to the Pythagoras theorem:

$$(D+d)^2+h^2=R^2 \quad (1)$$

According to a correspondence relationship between a length of the flexible screen in the unfolded status and a length of the flexible screen in the folded status, it can be known that:

$$D/2+d=m+\pi r/2 \quad (2)$$

In the folded status, to enable a gap between the flexible screen and the fixing plate 370 to be greater than or equal to 0, the following geometric relationship should be satisfied:

$$H-h-L-(m \cos \theta+r+r \sin \theta) \geq 0 \quad (3)$$

Where in the formula (3), the left side of the inequality corresponds to the gap between the flexible screen and the fixing plate 370. In the folded status, a length of a projection of a connection line in a vertical direction is m cos θ, where the connection line is a line between an orthographic projection of the bending center of the flexible screen on the planar regions of the flexible screen and the orthographic projection of the $O_{22}$ on the planar regions. In the folded status, a vertical height between the orthographic projection of the bending center of the flexible screen on the planar region of the flexible screen and the bending center of the flexible screen is equal to r sin θ.

According to the formulas (1), (2), and (3), in the design process of the foldable terminal 10, to enable the flexible screen to be flattened in the unfolded status and the gap between the flexible screen and the fixing plate 370 to be greater than or equal to 0 in the folded status, and prevent the service life of the flexible screen from being shortened due to improperly squeezing, the above parameters should make the following relationship true: $H \geq h+L+(\sqrt{R^2-h^2}-D/2-\pi r/2) \cos(\alpha/2)+r(1+\sin(\alpha/2))$, and the structure of each component can be designed according to the relationship. It should be noted that when the value of α is small, the two planar regions of the flexible screen are approximately parallel to each other in the folded status, and thus the above relationship can be simplified as follows: $H \geq h+L+\sqrt{R^2-h^2}-D/2-\pi r/2+r$.

As illustrated in FIG. 10, the fixing plate 370 has two opposite side edges, one of the two opposite side edges defines a first notch 371, and the other of the two opposite edges defines a second notch 373. When the foldable terminal 10 is in the folded status, the first rotating arm 340 passes through the first notch 371, and the second rotating arm 350 passes through the second notch 373. With the first notch 371 and the second notch 373, it is possible to provide a space for the rotation of the first rotating arm 340 and the second rotating arm 350, and enable a portion of the first rotating arm 340 above the fixing plate 370 and a portion of the second rotating arm 350 above the fixing plate 370 to get close to each other as much as possible when the foldable terminal 10 is in the folded status, thereby enabling the foldable terminal 10 to be thin in the folded status.

Figure 20:
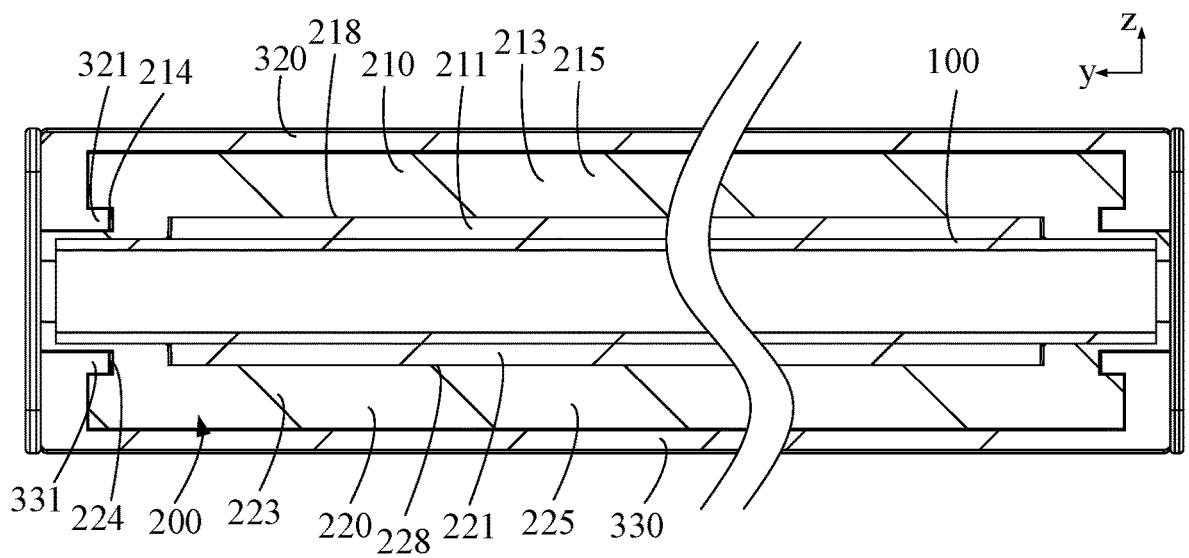
FIG. 20 is a cross-sectional view of the foldable terminal in FIG. 12, taken along line D-D.

As illustrated in FIG. 11, the first casing 210 includes a first support plate 211 and a first connecting plate 213 secured to the first support plate 211. The first connecting plate 213 is rotatably coupled with the first rotating arm 340 and slidably coupled with the first cover plate 320. The second casing 220 includes a second support plate 221 and a second connecting plate 223 secured to the second support plate 221 (as illustrated in FIG. 4). The second connecting plate 223 is rotatably coupled with the second rotating arm 350 and slidably coupled with the second cover plate 330. As illustrated in FIG. 9, FIG. 10, and FIG. 20, the first connecting plate 213 defines a first sliding groove 214, and the first cover plate 320 is provided with a first guide rail

321. The first guide rail 321 is received and slidable in the first sliding groove 214. The first sliding groove 214 can restrict and guide sliding of the first guide rail 321. During the rotation of the first support plate 211, the first support plate 211 is operable to drive the first cover plate 320 to rotate relative to the carrier plate 310 via the first connecting plate 213. A rotation space is formed between the first connecting plate 213 and the first cover plate 320, enabling the first rotating arm 340 to rotate relative to the first connecting plate 213. As illustrated in FIG. 20, the second connecting plate 223 defines a second sliding groove 224, and the second cover plate 330 is provided with a second guide rail 331. The second guide rail 331 is received and slidable in the second sliding groove 224. The second sliding groove 224 can restrict and guide sliding of the second guide rail 331. During the rotation of the second support plate 221, the second support plate 221 is operable to drive the second cover plate 330 to rotate relative to the carrier plate 310 via the second connecting plate 223. A rotation space is formed between the second connecting plate 223 and the second cover plate 330, enabling the second rotating arm 350 to rotate relative to the second connecting plate 223.

As illustrated in FIG. 4, the first connecting plate 213 includes a first body 215 and a first lug 217 integrally formed with the first body 215. As illustrated in FIG. 2, the second connecting plate 223 includes a second body 225 and a second lug 227 integrally formed with the second body 225. As illustrated in FIG. 2, when the foldable terminal 10 is in the unfolded status, the first lug 217 is inserted in the first notch 371, and the second lug 227 is inserted in the second notch 373. As illustrated in FIG. 19, when the foldable terminal 10 is in the unfolded status, one side of the first body 215 facing the display screen 100 and one side of the second body 225 facing the display screen 100 are respectively flush with one side of the fixing plate 370 facing the display screen 100. With aid of the cooperation of the first lug 217 and the first notch 371 and the cooperation of the second lug 227 and the second notch 373, when the foldable terminal 10 is in the unfolded status, a continuous support can be provided for the bendable portion 110 of the display screen 100 and the planar regions 120 coupled with the bendable portion 110, thereby enabling the display screen 100 to be smooth in the unfolded status, and thus facilitating use. For example, when the bendable portion 110 of the display screen 100 displays an interactive graphic interface, if the user touches this region, a concave surface does not occur in the display screen 100, thereby providing a good protection for the display screen 100.

As illustrated in FIG. 20, the first body 215 defines a first countersink 218. A part of the first support plate 211 can be received in the first countersink 218, and one side of the first support plate 211 facing the display screen 100 is flush with one side of the first body 215 facing the display screen 100. As illustrated in FIG. 4 and FIG. 20, the second body 225 defines a second countersink 228. A part of the second support plate 221 can be received in the second countersink 228. Combined with FIG. 19, one side of the second support plate 221 facing the display screen 100 is flush with one side of the second body 225 facing the display screen 100. With the first countersink 218 and the second countersink 228, it is beneficial to couple the first support plate 211 with the first connecting plate 213 and couple the second support plate 221 with the second connecting plate 223. Since the one side of the first support plate 211 facing the display screen 100 is flush with the one side of the first body 215 facing the display screen 100, and the one side of the second support plate 221 facing the display screen 100 is flush with the one side of the second body 225 facing the display screen 100, the display screen 100 can be effectively supported when in the unfolded status, and it is beneficial to unfold the display screen 100 to be flat.

The technical features of the above-described implementations may be arbitrarily combined. For the sake of brevity of description, not every combination of the technical features in the above implementations is described. However, as long as there is no contradiction of the combinations between the technical features, which shall fall within the protection scope.

The above-mentioned implementations merely some implementations. The specific and detailed illustration of the above implementations shall not be construed as limiting the scope of the claims. It should be noted that for a person skilled in the art, a number of variations and modifications may be obtained without departing from the spirit and scope. Therefore, the scope should be determined by the appended claims.

What is claimed is:

1. A foldable terminal, comprising:
   a casing assembly comprising a first casing and a second casing;
   a display screen coupled with the first casing and the second casing; and
   a foldable mechanism comprising a carrier plate, a first cover plate, a second cover plate, a first rotating arm, and a second rotating arm, wherein the carrier plate has a first side rotatably coupled with the first cover plate and a second side rotatably coupled with the second cover plate, the first casing defines a first sliding groove at an end rotatably coupled to one end of the first rotating arm, the first cover plate is provided with a first guide rail slidably received in the first sliding groove, the second casing defines a second sliding groove at an end rotatably coupled to one end of the second rotating arm, the second cover plate is provided with a second guide rail slidably received in the second sliding groove, another end of the first rotating arm is rotatably coupled with the second side of the carrier plate, and another end of the second rotating arm is rotatably coupled with the first side of the carrier plate,
   wherein when the foldable terminal is switched between unfolded status and folded status, the first guide rail is capable of sliding back and forth in the first sliding groove, and the second guide rail is capable of sliding back and forth in the second sliding groove.

2. The foldable terminal of claim 1, wherein the foldable mechanism further comprises:
   a first rotating shaft rotatably coupled with the first side of the carrier plate;
   a second rotating shaft rotatably coupled with the second side of the carrier plate;
   a third rotating shaft coupled with the carrier plate;
   a fourth rotating shaft coupled with the carrier plate;
   a first gear coupled with the first rotating shaft;
   a second gear coupled with the second rotating shaft;
   a third gear coupled with the third rotating shaft; and
   a fourth gear coupled with the fourth rotating shaft;
   the first rotating arm is coupled with the second rotating shaft, and the second rotating arm is coupled with the first rotating shaft;
   the first gear and the fourth gear are respectively engaged with the third gear, and the second gear is engaged with the fourth gear; and the first casing is operable to rotate the second gear via the first rotating arm, and the second casing is operable to rotate the first gear via the second rotating arm.

3. The foldable terminal of claim 1, wherein the carrier plate defines a receiving groove, wherein when the foldable terminal is in the unfolded status, the first rotating arm and the second rotating arm are received in the receiving groove; when the foldable terminal is in the folded status, the other end of the first rotating arm coupled with the first casing is far away from a bottom of the receiving groove, and the other end of the second rotating arm coupled with the second casing is far away from the bottom of the receiving groove.

4. The foldable terminal of claim 3, wherein the carrier plate has a bottom wall, a first side wall, a second side wall opposite the first side wall, a first end wall, and a second end wall opposite the first end wall, the first side wall is coupled with one side edge of the bottom wall and the second side wall is coupled with the other side edge of the bottom wall, wherein the first end wall is coupled with one end of the bottom wall, one end of the first side wall, and one end of the second side wall, the second end wall is coupled with the other end of the bottom wall, the other end of the first side wall, and the other end of the second side wall, wherein the first side wall, the first end wall, the second side wall, the second end wall, and the bottom wall cooperatively define the receiving groove, wherein the first side wall of the carrier plate is located at the first side of the carrier plate, and the second side wall of the carrier plate is located at the second side of the carrier plate.

5. The foldable terminal of claim 4, wherein
the first rotating arm comprises an extension section, a bendable section, and a connection section, wherein the extension section, the bendable section, and the connection section are integrally formed, the bendable section is disposed between the extension section and the connection section, the extension section is coupled with the first casing, and the connection section is coupled with the second side wall, wherein the bottom wall defines a recess communicating with the receiving groove, wherein the recess has a larger sectional curvature than the receiving groove, the bendable section has the same sectional curvature as the receiving groove, wherein when the foldable terminal is in the unfolded status, the bendable section is received in the recess; and
the second rotating arm comprises an extension section, a bendable section, and a connection section, wherein the extension section, the bendable section, and the connection section are integrally formed, the bendable section is disposed between the extension section and the connection section, the extension section is coupled with the second casing, and the connection section is coupled with the first side wall, wherein the bottom wall defines a recess communicating with the receiving groove, wherein the recess has a larger sectional curvature than the receiving groove, the bendable section has the same sectional curvature as the receiving groove, wherein when the foldable terminal is in the unfolded status, the bendable section is received in the recess.

6. The foldable terminal of claim 4, wherein:
the carrier plate further comprises a mounting plate coupled with the first side wall and the second side wall; and
the foldable mechanism comprises a first rotating shaft rotatably coupled with one end of the mounting plate close to the first side wall and a second rotating shaft rotatably coupled with the other end of the mounting plate close to the second side wall, wherein the first rotating arm is coupled with the second rotating shaft, and the second rotating arm is coupled with the first rotating shaft.

7. The foldable terminal of claim 1, wherein the foldable mechanism further comprises a fixing plate secured to the carrier plate, and the fixing plate has two opposite side edges, wherein one of the two opposite side edges defines a first notch, and the other of the two opposite edges defines a second notch, wherein when the foldable terminal is in unfolded status, the fixing plate abuts against the display screen, and when the foldable terminal is in folded status, the fixing plate and the display screen define a gap, and the one end of the first rotating arm rotatably coupled to the first casing passes through the first notch, and the one end of the second rotating arm rotatably coupled to the second casing passes through the second notch.

8. The foldable terminal of claim 7, wherein:
the first casing comprises a first support plate and a first connecting plate secured to the first support plate, wherein the first connecting plate is rotatably coupled with the first rotating arm and slidably coupled with the first cover plate, the first connecting plate defines the first sliding groove, and the first support plate is operable to drive the first cover plate to rotate relative to the carrier plate via the first connecting plate; and
the second casing comprises a second support plate and a second connecting plate secured to the second support plate, the second connecting plate is rotatably coupled with the second rotating arm and slidably coupled with the second cover plate, the second connecting plate defines the second sliding groove, and the second support plate is operable to drive the second cover plate to rotate relative to the carrier plate via the second connecting plate.

9. The foldable terminal of claim 7, wherein
the first casing comprises a first support plate and a first connecting plate secured to the first support plate, wherein the first connecting plate comprises a first body and a first lug integrally formed with the first body; and
the second casing comprises a second support plate and a second connecting plate secured to the second support plate, wherein the second connecting plate comprises a second body and a second lug integrally formed with the second body, wherein when the foldable terminal is in the unfolded status, the first lug is inserted in the first notch, and the second lug is inserted in the second notch.

10. The foldable terminal of claim 1, wherein the foldable terminal further comprises a damping assembly coupled with the foldable mechanism, and the foldable mechanism comprises a first rotating shaft rotatably coupled with the first side of the carrier plate and a second rotating shaft rotatably coupled with the second side of the carrier plate, wherein the first rotating arm is coupled with the second rotating shaft, and the second rotating arm is coupled with the first rotating shaft;
the damping assembly comprises an elastic member, a movable cam, and a fixing cam, wherein the movable cam is slidably disposed on the first rotating shaft or the second rotating shaft, the fixing cam is disposed on the carrier plate, and the elastic member elastically abuts against both the carrier plate and the movable cam, enabling the movable cam to abut against the fixing cam; and one side of the movable cam facing the fixing cam is provided with a first protrusion, and one side of the fixing cam facing the movable cam is provided with a second protrusion, wherein when the foldable terminal is switched between unfolded status and folded status, the first protrusion slides along the second protrusion to change an extrusion pressure exerted on the movable cam by the elastic member.

11. A foldable terminal, comprising:

a flexible screen;

a casing assembly comprising a first casing and a second casing, wherein the first casing and the second casing are respectively coupled with the flexible screen; and a foldable mechanism comprising a carrier plate, a first cover plate, a second cover plate, a first rotating arm, and a second rotating arm, wherein the first cover plate and the second cover plate are rotatably coupled with the carrier plate respectively, wherein the first rotating arm has one end rotatably coupled with the carrier plate and the other end rotatably coupled with the first casing, wherein the second rotating arm has one end rotatably coupled with the carrier plate and the other end rotatably coupled with the second casing; wherein when the foldable terminal is switched between unfolded status and folded status, the first casing drives the first cover plate to rotate relative to the carrier plate and a part of the first casing is slidably extended out of or retracted into the first cover plate, the second casing drives the second cover plate to rotate relative to the carrier plate and a part of the second casing is slidably extended out of or retracted into the second cover plate;

when the foldable terminal is switched between the unfolded status and the folded status, the first casing is capable of sliding back and forth relative to the first cover plate and the second casing is capable of sliding back and forth relative to the second cover plate;

when the foldable terminal is in the folded status, an orthogonal projection of the first rotating arm on a reference plane and an orthogonal projection of the second rotating arm on the reference plane intersect, wherein the reference plane is a geometric plane perpendicular to a width direction of the foldable terminal; and the first rotating arm and the second rotating arm each comprise an extension section, a bendable section, and a connection section, the extension section, the bendable section, and the connection section are integrally formed, and a bending degree of the bendable section when the foldable terminal is in the folded status is different from that of the bendable section when the foldable terminal is in the unfolded status.

12. The foldable terminal of claim 11, wherein the foldable terminal comprises a damping assembly coupled with the foldable mechanism, and the foldable mechanism further comprises a first rotating shaft rotatably coupled with the carrier plate, and a second rotating shaft rotatably coupled with the carrier plate, wherein the first rotating arm is coupled with the second rotating shaft, and the second rotating arm is coupled with the first rotating shaft, wherein when the foldable terminal is switched between the unfolded status and the folded status, the damping assembly is able to change rotational damping of the casing assembly.

13. The foldable terminal of claim 12, wherein the damping assembly comprises a spring sleeved on the first rotating shaft, a movable cam sleeved on the first rotating shaft and slidable along the first rotating shaft, and a fixing cam fixedly coupled with the carrier plate, wherein one end of the spring abuts against the first rotating shaft, and the other end of the spring abuts against the movable cam, and wherein when the foldable terminal is switched between the unfolded status and the folded status, the movable cam abuts against the fixing cam; and one side of the movable cam facing the fixing cam is provided with a first protrusion, and one side of the fixing cam facing the movable cam is provided with a second protrusion, wherein when the foldable terminal is switched between the unfolded status and the folded status, the first protrusion slides along the second protrusion to change an extrusion pressure exerted on the movable cam by the spring.

14. The foldable terminal of claim 11, wherein the carrier plate defines a receiving groove, wherein when the foldable terminal is in the folded status, the other end of the first rotating arm coupled with the first casing extends out from the receiving groove, and the other end of the second rotating arm coupled with the second casing extends out from the receiving groove, and when the foldable terminal is in the unfolded status, the first rotating arm and the second rotating arm are received in the receiving groove.

15. The foldable terminal of claim 14, wherein the foldable mechanism further comprises a fixing plate secured to the carrier plate, and the fixing plate has two opposite side edges, wherein one of the two opposite side edges defines a first notch, and the other of the two opposite edges defines a second notch, wherein when the foldable terminal is in the unfolded status, the fixing plate abuts against the flexible screen, and when the foldable terminal is in the folded status, the fixing plate and the flexible screen define a gap, and the first rotating arm passes through the first notch, and the second rotating arm passes through the second notch.

16. The foldable terminal of claim 15, wherein:

the first casing comprises a first support plate and a first connecting plate secured to the first support plate, wherein the first connecting plate is rotatably coupled with the first rotating arm and slidably coupled with the first cover plate, the first connecting plate defines a first sliding groove, and the first cover plate is provided with a first guide rail, wherein the first guide rail is received and slidable in the first sliding groove, and the first support plate is operable to drive the first cover plate to rotate relative to the carrier plate via the first connecting plate; and the second casing comprises a second support plate and a second connecting plate secured to the second support plate, wherein the second connecting plate is rotatably coupled with the second rotating arm and slidably coupled with the second cover plate, the second connecting plate defines a second sliding groove, and the second cover plate is provided with a second guide rail, wherein the second guide rail is received and slidable in the second sliding groove, and the second support plate is operable to drive the second cover plate to rotate relative to the carrier plate via the second connecting plate.

17. The foldable terminal of claim 15, wherein the first casing comprises a first support plate and a first connecting plate secured to the first support plate, wherein the first connecting plate comprises a first body and a first lug integrally formed with the first body; and the second casing comprises a second support plate and a second connecting plate secured to the second support plate, wherein the second connecting plate comprises a second body and a second lug integrally formed with the second body, wherein when the foldable terminal is in the unfolded status, the first lug is inserted in the first notch, and the second lug is inserted in the second notch.

18. The foldable terminal of claim 17, wherein
when the foldable terminal is in the unfolded status, one side of the first body facing the flexible screen and one side of the second body facing the flexible screen are respectively flush with one side of the fixing plate facing the flexible screen;

the first body defines a first countersink, wherein a part of the first support plate is received in the first countersink and one side of the first support plate facing the flexible screen is flush with one side of the first body facing the flexible screen; and the second body defines a second countersink, wherein a part of the second support plate is received in the second countersink, and one side of the second support plate facing the flexible screen is flush with one side of the second body facing the flexible screen.

19. The foldable terminal of claim 11, wherein the foldable mechanism further comprises a baffle, wherein the baffle comprises a plate body and two pin shafts, wherein the plate body and the two pin shafts are integrally formed, one of the two pin shafts passes through the carrier plate and the first cover plate, and the other of the two pin shafts passes through the carrier plate and the second cover plate, wherein the first cover plate and the second cover plate are rotatably coupled with the carrier plate through the two pin shafts respectively.

20. A foldable terminal, comprising:
a casing assembly;
a display screen coupled with the casing assembly and comprising a non-display surface and a display surface opposite the non-display surface; and
a foldable mechanism comprising a first rotating arm, a second rotating arm, a carrier plate and a fixing plate secured to the carrier plate, wherein the fixing plate defines two notches at two opposite side edges of the fixing plate, the two opposite side edges are parallel to a width direction of the foldable terminal, and the first rotating arm and the second rotating arm each have an end rotatably coupled to the casing assembly, wherein when the foldable terminal is in unfolded status, the fixing plate abuts against the non-display surface of the display screen, and when the foldable terminal is in folded status, the fixing plate and the display screen define a gap, the non-display surface is parallel to the display surface, and the end of the first rotating arm and the end of the second rotating arm that are rotatably coupled to the casing assembly pass through the notches, respectively,
wherein the first rotating arm and the second rotating arm each comprise an extension section, a bendable section, and a connection section, the extension section, the bendable section, and the connection section are integrally formed, and a bending degree of the bendable section when the foldable terminal is in the folded status is different from that of the bendable section when the foldable terminal is in the unfolded status.

* * * * *